(12) United States Patent
Hussain

(10) Patent No.: US 8,195,439 B1
(45) Date of Patent: Jun. 5, 2012

(54) REAL-TIME ADAPTIVE CIRCUIT SIMULATION

(75) Inventor: Syed Zakir Hussain, Hillsborough, CA (US)

(73) Assignee: Infinisim, Inc., Alviso, CA (US)

( * ) Notice: Subject to any disclaimer, the term of this patent is extended or adjusted under 35 U.S.C. 154(b) by 624 days.

(21) Appl. No.: 12/264,246

(22) Filed: Nov. 3, 2008

Related U.S. Application Data

(60) Provisional application No. 61/093,718, filed on Sep. 2, 2008, provisional application No. 61/094,054, filed on Sep. 3, 2008, provisional application No. 61/105,755, filed on Oct. 15, 2008, provisional application No. 61/109,168, filed on Oct. 28, 2008, provisional application No. 61/109,906, filed on Oct. 30, 2008, provisional application No. 61/110,529, filed on Oct. 31, 2008.

(51) Int. Cl.
*G06F 17/50* (2006.01)

(52) U.S. Cl. .......................................................... 703/14

(58) Field of Classification Search ................ 703/14; 716/104, 106
See application file for complete search history.

(56) References Cited

U.S. PATENT DOCUMENTS

| | | | |
|---|---|---|---|
| 5,671,399 A | 9/1997 | Meier | |
| 6,038,381 A | 3/2000 | Münch et al. | |
| 6,086,626 A | 7/2000 | Jain et al. | |
| 6,577,992 B1 | 6/2003 | Tcherniaev et al. | |
| 6,816,826 B1 | 11/2004 | Anderson et al. | |
| 7,013,253 B1 | 3/2006 | Cong et al. | |
| 7,047,510 B1 | 5/2006 | Chopra et al. | |
| 7,181,708 B1 | 2/2007 | Du et al. | |
| 7,493,578 B1 | 2/2009 | Milne et al. | |
| 7,555,733 B1 | 6/2009 | Gee et al. | |
| 2002/0133325 A1* | 9/2002 | Hoare et al. | 703/17 |
| 2002/0183990 A1* | 12/2002 | Wasynczuk et al. | 703/2 |
| 2003/0163297 A1 | 8/2003 | Khaira et al. | |
| 2004/0093571 A1 | 5/2004 | Jain et al. | |
| 2005/0081173 A1 | 4/2005 | Peyran | |
| 2006/0129953 A1 | 6/2006 | Jain | |
| 2007/0044051 A1 | 2/2007 | McGaughy et al. | |
| 2009/0300556 A1 | 12/2009 | Gee et al. | |
| 2009/0300566 A1 | 12/2009 | Gee et al. | |

OTHER PUBLICATIONS

V. Rao, D. Overhauser, I. Hajj, and T. Trick, *Switch Level Timing Simulation of MOS VLSI Circuits*, Boston: Kluwer Academic Publishers, pp. 30-47, 71-91, Month N/A 1989.
V. Rao and T. Trick, Network partitioning and ordering for MOS VLSI circuits, *IEEE Transactions on Computer-Aided Design*, vol. CAD-6, No. 1, pp. 128-144, Jan. 1987.

(Continued)

*Primary Examiner* — Dwin M Craig
(74) *Attorney, Agent, or Firm* — Adeli & Tollen LLP

(57) ABSTRACT

Some embodiments simulate a mixed-signal circuit design by adaptively applying multiple simulation engines at various regions of the design at various stages of the simulation. Some embodiments partition the mixed-signal design into multiple regions. Some embodiments classify the regions at different time steps of transient analysis. The regions are classified to indicate whether a region is active or inactive at each such time step. Then when analyzing the active regions, some embodiments adaptively apply different solvers to at least two of the active regions based on criteria associated with the active regions. Additionally, some embodiments perform an adaptive bi-direction analysis of the regions. In this manner, some embodiments optimize the circuit simulation by adaptively simulating the design using different solvers that employ greater accuracy where required and greater efficiency when less accuracy is required, thus allowing the simulation to occur with greater overall accuracy, efficiency, and capacity.

23 Claims, 22 Drawing Sheets

OTHER PUBLICATIONS

R. Tarjan, "Depth-first search and linear graph algorithms," *SIAM Journal of Computing*, vol. 1, No. 2, pp. 146-160, Jun. 1972.

Updated portions of prosecution history of U.S. Appl. No. 11/532,898, Mailed May 22, 2009, Gee, Perry, et al.

Updated portions of prosecution history of U.S. Appl. No. 12/471,344, Mailed Nov. 14, 2011, Gee, Perry, et al.

Updated portions of prosecution history of U.S. Appl. No. 12/471,343, Mailed Aug. 3, 2011, Gee, Perry, et al.

Portions of prosecution history of U.S. Appl. No. 12/264,247, Mailed Oct. 18, 2011, Hussain, Syed Zakir.

Amelifard, Behnam, et al., "Low-Power Fanout Optimization Using Multiple Threshold Voltage Inverters," International Symposium on Low Power Electronics and Design, Aug. 8-10, 2005, ACM.

Davis, Albert Tatum, "Implicit Mixed-Mode Simulation of VLSI Circuits," Month Unknown, 1991, pp. 108-112 and 120, Department of Electrical Engineering, College of Engineering and Applied Science, University of Rochester, Rochester, New York.

Martin, Dale E., et al., "Integrating Multiple Parallel Simulation Engines for Mixed-Technology Parallel Simulation," Proceedings of the $35^{th}$ Annual Simulation Symposium, Month Unknown, 2002, IEEE.

Steer, Michael B., "SPICE: User's Guide and Reference," Jul. 2, 2007, pp. 55-57, Edition 1.3, Michael B. Steer.

Updated portions of prosecution history of U.S. Appl. No. 11/532,898, Mailed May 18, 2009, Gee, Perry, et al.

Preliminary Amendment of U.S. Appl. No. 12/471,344, Mailed Oct. 7, 2009, Gee, Perry, et al.

Preliminary Amendment of U.S. Appl. No. 12/471,343, Mailed Oct. 7, 2009, Gee, Perry, et al.

U.S. Appl. No. 11/532,898, dated Sep. 18, 2006, Gee, Perry et al.

Non-Final Office Action of U.S. Appl. No. 11/532,898, dated Aug. 18, 2008, Gee, Perry et al.

Notice of Allowance of U.S. Appl. No. 11/532,898, dated Feb. 18, 2009, Gee, Perry et al.

U.S. Appl. No. 12/264,247, Nov. 3, 2008, Syed Zakir Hussain.

Updated portions of prosecution history of U.S. Appl. No. 11/532,898, dated May 18, 2009, Gee, Perry et al.

Preliminary Amendment of U.S. Appl. No. 12/471,344, dated Oct. 7, 2009, Gee, Perry et al.

Preliminary Amendment of U.S. Appl. No. 12/471,343, dated Oct. 7, 2009, Gee, Perry et al.

Hussain, S.Z., "Adaptive Design Verification of Digital VLSI Systems", Department of Electrical Engineering, Graduate School of Duke University, 1995, Month Unknown, chapter 3, pp. 25-60, Durham, North Carolina.

* cited by examiner

REAL-TIME ADAPTIVE CIRCUIT SIMULATION

CLAIM OF BENEFIT TO PRIOR APPLICATION

This patent application claims the benefit of the U.S. Provisional Patent Application 61/093,718, entitled "Method for Mixed Signal Simulation", filed Sep. 2, 2008; the U.S. Provisional Patent Application 61/094,054, entitled "Method for Mixed Signal Simulation", filed Sep. 3, 2008; the U.S. Provisional Patent Application 61/105,755, entitled "Real-Time Adaptive Circuit Simulation", filed Oct. 15, 2008; the U.S. Provisional Patent Application 61/109,168, entitled "Real-Time Adaptive Circuit Simulation", filed Oct. 28, 2008; the U.S. Provisional Patent Application 61/109,906, entitled "Real-Time Adaptive Circuit Simulation", filed Oct. 30, 2008; and the U.S. Provisional Patent Application 61/110,529, entitled "Real-Time Adaptive Circuit Simulation", filed Oct. 31, 2008. The contents of the above mentioned applications, namely 61/093,718, 61/094,054, 61/105,755, 61/109,168, 61/109,906, and 61/110,529 are hereby incorporated by reference.

CROSS REFERENCE TO RELATED APPLICATIONS

This Application is related to the following application: U.S. patent application Ser. No. 12/264,247, filed Nov. 3, 2008.

FIELD OF THE INVENTION

The invention relates to the field of analog and digital circuit simulation.

BACKGROUND OF THE INVENTION

Mixed-signal integrated circuits (ICs) that include both analog and digital devices represent a significant and growing segment of the semiconductor market. Mixed-signal design content and design complexity is also growing concurrently with the growth in the overall number of mixed-signal designs. This is driven partly by a need to apply digital correction techniques to analog circuits in large system-on-chip ICs (built in 90 nm and lower process nodes), and partly by the need to support ever-increasing bandwidth and functionality requirements of ICs that enable wireline/wireless communications and consumer electronics products. From the electrical design point of view, the connectivity between analog circuits and digital circuits is evolving from loosely-coupled interfaces to tightly-coupled micro-architectural and circuit level integration within mixed-signal blocks. Consumer electronics products contain significant amount of mixed-signal designs as the inputs are mostly analog (human interaction), while storage is in digital format (flash memories, etc).

Both analog and digital designs have always relied on simulators for functional verification. Traditionally, the simulation techniques applied to analyze and to verify the analog and digital blocks within ICs were handled separately. However, current approaches to addressing mixed-signal simulation fall short of mixed-signal analysis and verification requirements. This is mainly because these technologies, many of which have been in existence for more than 15 years, are being retrofitted for modern mixed-signal designs. The following techniques have been used in the past, but are no longer adequate: (1) Simulation Program with Integrated Circuit Emphasis (SPICE) simulation using sparse matrix solvers, (2) FastSpice simulation using multi-rate algorithms, and (3) a hybrid approach.

SPICE simulation involves reading a transistor level circuit and building a flat matrix with all the parameters. This matrix is solved for DC analysis and for each time step of a transient analysis. As a result, the simulator creates an instantaneous model for the whole circuit at each time step using just the device models. This technique is very accurate because (1) it correctly solves Kirchhoff's Current Law (KCL) and Kirchhoff's Voltage Law (KVL), which are the fundamental laws governing all electrical networks, (2) it correctly models circuit behavior by using the full device models which have been calibrated against the silicon foundries manufacturing capabilities, and (3) it models the chip as one complete system.

FIG. 1 presents a process 100 performed by a typical SPICE simulation implementation to simulate a design. The process 100 begins by receiving (at 110) a design for simulation. The process performs DC analysis (at 120) over the entire design. Next, the process performs transient analysis of the entire design over a series to ascending time steps. The process selects (at 130) a time step and for each time step of the transient analysis, the process computes (at 140) a state for a non-linear matrix that mathematically models the entire design. The process linearizes (at 150) the matrix such that it can be solved (at 160) in one or more iterations. The process then repeats (at 170) for each time step of the transient analysis.

As the circuit size increases, the simulation time for the process 100 and other such simulation processes or techniques increases super-linearly (i.e., exponentially). This puts a practical limit on simulation capacity using this approach. Recently, several companies have introduced improved offerings based on conventional SPICE engines with more efficient algorithms or engines that use parallelization. While these products have delivered moderate (e.g., 5-10×) increase in simulation speeds and modest improvement in overall capacity, they fall short of adequately meeting the challenges of large mixed-signal designs.

In FastSpice simulation, the circuit is divided into multiple partitions and each partition is simulated with its own time step (asynchronously) using simplified device models. These models can be voltage-based tables, current-based tables, analytical macro-models. Such simulators are often very fast and capable of handling large circuits. However, these simulations suffer from accuracy degradation because of a manual setting of accuracy-tolerance, a fundamental reliance on macro-models to approximately represent circuit behavior, a failure to adhere to Kirchhoff's Current Law (KCL) and Kirchhoff's Voltage Law (KVL), and a dependence on event-based simulation.

Specifically, designers can set the desired accuracy level for their simulations in order to trade-off accuracy against speed. Not understanding these settings properly can result in invalid results. Additionally, these simulators can only produce accuracy up to 5% of SPICE. This is due to the simulator's fundamental reliance on macro-models to approximately represent circuit behavior. Such reliance results in a trade-off between (1) nominal and corner case accuracy and (2) simulation speed. The trade-off is a result of the macro-models that are either table lookup or algorithmic simplifications to the full device models provided by silicon foundries. Also, by not solving Kirchhoff's Current Law (KCL) and Kirchhoff's Voltage Law (KVL), the simulators do not adhere to the fundamental circuit simulation accuracy requirement of charge conservation. Lastly, the dependence on event-based simulation further detrimentally affects accuracy of the simulation as event propagation across partition boundaries is only triggered when there is significant change in voltage.

Some designers get around the accuracy issues in FastSpice and the capacity issues in SPICE by using a hybrid approach. To do so, IC designers manually select the partitions in which they make accuracy-capacity trade-offs, based on prior experience and judgment. The problem with this approach is that designers are required to prejudge and hence bias the simulation, which can result in design error escapes. These errors are especially insidious at the digital-analog interfaces. This approach runs counter to simulation requirements which are becoming increasingly more stringent to address the growth in size, complexity, and performance of mixed-signal designs and adds risk to the critical design analysis and verification process. Such risks can contribute to silicon malfunction and thus the need and added cost for silicon respins to correct the design.

In summary, each of the above described techniques and other existing electrical circuit simulation techniques has a specific scope of application in terms of speed and accuracy of results. Additionally, each of these techniques has a capacity limit that restricts the size of the design that can be simulated efficiently. The speed of the simulations and the accuracy of their results can be traded-off by limiting the number of iterations or by using different simulation engines. These tradeoffs render the conventional simulators and techniques inadequate for today's mixed-signal designs and upcoming mixed-signal design requirements. Accordingly, the requirements for mixed-signal simulators are growing apace for the following reasons:

First, mixed-signal designs tend to be larger than pure analog designs. Hence mixed-signal simulators must be able to handle these large designs, of up to 10M elements or more, without requiring a trade-off between capacity and throughput/performance.

Second, mixed-signal designs require higher accuracy than purely digital designs. Purely digital designs often have circuits with one of two states (e.g., 0 or 1) whereas analog circuits may have several different states. The higher accuracy for analog circuits is needed in order to indentify and address complex effects, like voltage changes and timing, resulting from dynamically changing operational conditions which affect device functionality and yield. For instance, a 14-bit sample-and-hold circuit (e.g., an analog to digital converter (ADC)) requires voltage accuracy on the order of one micro-Volt. Additionally, this sample-and-hold circuit requires high accuracy in order to model settling error correctly which, if ignored, can easily swamp out the lower order bits.

Third, mixed-signal designs tend to have coupling between various physical components. Substrate noise, electromagnetic coupling and inductive coupling effects are a few manifestations of such physical interaction between integrated circuit elements. These effects must be simulated accurately with post-layout parasitics annotated to the netlist/schematic to ensure that the circuit works correctly under nominal and corner case conditions, thereby dramatically increasing the capacity requirements of the simulator.

Fourth, mixed-signal designs have very tight variation tolerances across operating modes. This means that a large number of simulations need to be run across multiple modes, with high accuracy. In other words, the chip needs to be simulated under more conditions than a purely analog or digital chip.

Fifth, mixed-signal designs are more sensitive to variation in process, voltage, and temperature (PVT) corners. These variations must be simulated accurately to ensure that the entire chip works correctly across the operational and manufacturing process range.

These issues have profound implications on the design of mixed-signal chips. Designers would like to run an adequate number of simulations to ensure that the necessary analysis and verification coverage of the design-space, environment-space, and manufacturing-space is achieved prior to tapeout. With conventional techniques and/or simulators, it is not feasible to run all these techniques and/or simulations at the required accuracy and achieve adequate coverage within practical schedule constraints. This constraint forces IC designers to trade-off the level of coverage achieved before tapeout with the overall development schedule, contributing to the risk of device malfunction, reduced yield and silicon respins. Such delays can jeopardize the economic return on the IC as the end-product. These delays result in an increased risk of missing a target window or an increased risk of shipping an incorrectly-functioning IC.

Therefore, all of the above approaches provide sub-optimal results for present day mixed-signal simulation because they inherently trade-off accuracy, capacity, and performance. Accordingly, a new method and system is required that simulates a circuit design while delivering performance and capacity without compromising on accuracy.

SUMMARY OF THE INVENTION

Some embodiments simulate a mixed-signal integrated circuit (IC) design by adaptively applying two or more simulation engines at various regions of the design at various stages of the circuit simulation. Some embodiments simulate the design using an adaptive DC analysis and an adaptive transient analysis.

To optimize the adaptive simulation, some embodiments partition the mixed-signal design into multiple regions. Some embodiments then solve only those regions that change state beyond a specified threshold between different steps of the simulation analysis. When solving the active regions, some embodiments adaptively apply different simulation engines to at least two of the active regions based on criteria associated with the active regions. In this manner, the adaptive simulation performed by some embodiments optimizes the circuit simulation by using different simulation engines that employ greater accuracy where required and greater efficiency when less accuracy is required, thus allowing the simulation to occur with greater overall accuracy, efficiency, and capacity.

To facilitate the adaptive simulation, some embodiments partition each region to contain either a set of linear devices or a set of non-linear devices of the circuit design. Some embodiments adaptively simulate the partitioned regions by utilizing one or more linear solver simulation engines to solve each active linear region and by utilizing one or more non-linear solver simulation engines to solve each active non-linear region.

Some embodiments solve the active regions adaptively by using different simulation engines depending on the amount of variation occurring at an active region at a current time step relative to a previous time step. In some embodiments, the amount of variance is computed based on a state transition at the active region between the time steps relative to a user specified threshold. For a lesser amount of variance, some embodiments select a less accurate but faster simulation engine to solve and simulate the active region. For a greater amount of variance, some embodiments select a more accurate and thus more time consuming simulation engine to solve and simulate the active region.

Some embodiments solve the active regions by adaptively modifying the information within an active region in order to increase accuracy or increase efficiency when required. For instance, some embodiments perform a uni-directional analysis or a bi-directional analysis for regions that require greater accuracy by accounting for fan-ins of at least one neighboring region into the active region and/or fan-outs of the active region into at least one neighboring region. Moreover, some embodiments adaptively include one or more fan-ins or one or more fan-outs based on the accuracy based on the amount of state change. In this manner, some embodiments increase the accuracy of the simulation by accounting for dependencies between the various regions when required.

Some embodiments perform the adaptive simulation in real-time whereby the simulation automatically adapts to circuit conditions occurring at each region at each time step of the analysis. Specifically, the simulation speeds up (computes fewer time-points for less accuracy) to take advantage of circuit latencies as these occur and slows down (computes more time-points for greater accuracy) appropriately as circuit activity requires.

BRIEF DESCRIPTION OF THE DRAWINGS

The novel features of the invention are set forth in the appended claims. However, for the purpose of explanation, several embodiments of the invention are set forth in the following figures.

DETAILED DESCRIPTION OF THE INVENTION

In the following description, numerous details are set forth for the purpose of explanation. However, one of ordinary skill in the art will realize that the invention may be practiced without the use of these specific details. In other instances, well-known structures and devices are shown in block diagram form in order not to obscure the description of the invention with unnecessary detail.

I. Overview

Some embodiments simulate a mixed-signal integrated circuit (IC) design by adaptively applying two or more simulation engines at various regions of the design at various stages of the circuit simulation. Some embodiments simulate the design using an adaptive DC analysis and an adaptive transient analysis.

To optimize the adaptive simulation, some embodiments partition the mixed-signal design into multiple regions. Some embodiments then solve only those regions that change state beyond a specified threshold between different steps of the simulation analysis. When solving the active regions, some embodiments adaptively apply different simulation engines to at least two of the active regions based on criteria associated with the active regions. In this manner, the adaptive simulation performed by some embodiments optimizes the circuit simulation by using different simulation engines that employ greater accuracy where required and greater efficiency when less accuracy is required, thus allowing the simulation to occur with greater overall accuracy, efficiency, and capacity.

Figure 1:
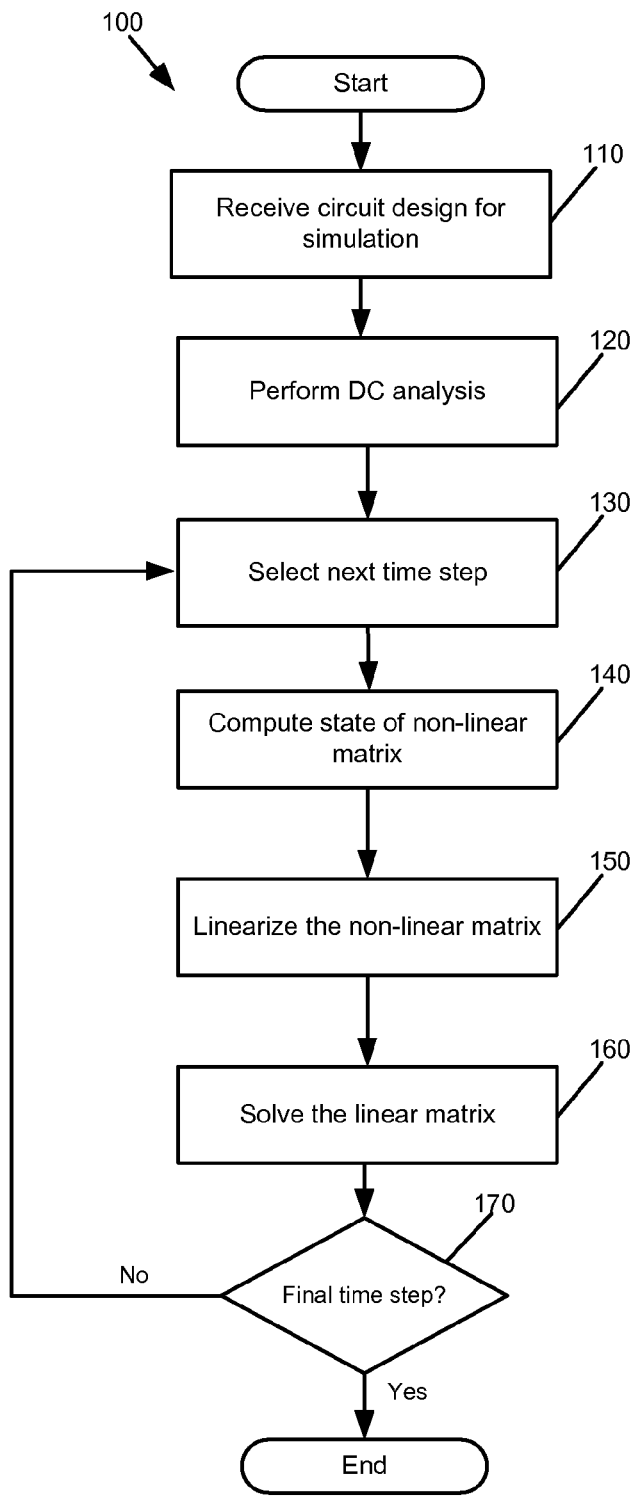
FIG. 1 presents a process performed by a typical SPICE simulation implementation to simulate a design.
Figure 2:
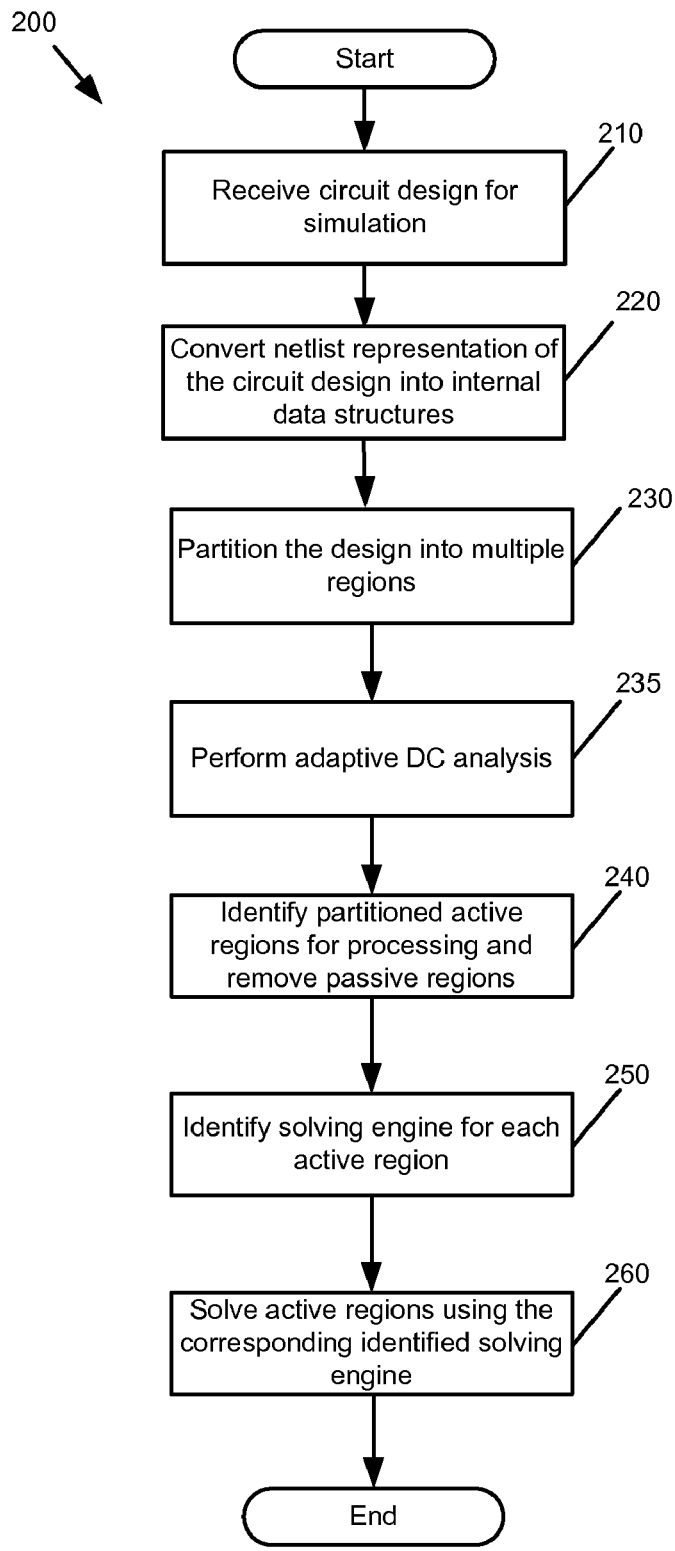
FIG. 2 illustrates a process for performing real-time adaptive simulation in accordance with some embodiments of the invention.

FIG. 2 illustrates one example of such a process for some embodiments of the invention. As shown in FIG. 2, the process 200 initially receives (at 210) a mixed-signal IC design. In some embodiments, the IC design includes a netlist and device models. The netlist describes a circuit in terms of devices and their connectivity via nodes. Device models provide electrical behavior in terms of terminal currents and charges under specific voltage and temperature conditions.

To simulate the design, the process converts (at 220) the netlist into a set of internal data structures that are stored internally within one or more databases of some embodiments. This conversion step allows for a netlist defined using any one of several formats (e.g., SPICE, Verilog, Spectre, etc.) to be simulated using the real-time adaptive simulation process of some embodiments.

The process then partitions (at 230) the design into several regions. The partitioning of the design decomposes the complex overall system matrix that would otherwise be used to mathematically model the entire circuit design into several more manageable regions, each region separately modeled with a set of equations based on Kirchhoff's current laws (i.e., KCL equations) and equations in terms of Kirchhoff's voltage laws (i.e., KVL equations). As described further below, some embodiments model each region through a Modal Nodal Analysis (MNA).

Each of the partitioned regions undergoes (at 235) an adaptive DC analysis as described in further detail in Subsection III A below. The process performs the adaptive DC analysis to efficiently and accurately determine operating points of the design. These operating points ascertain the startup or power-on behavior of the circuits of the design to confirm that there are no stray current and voltages in the ramp-up to normal operation. Additionally, the operating points determine transient initial conditions for subsequent transient analysis.

The adaptive DC analysis solves the design to derive operating points that assume an equilibrium state. Operating points assume an equilibrium state when the solutions at the operating points do not change with time. Specifically, the circuits represented by the operating points reach an equilibrium when the stimulus no longer changes or where slight changes to the stimulus return to the same equilibrium solution. In some embodiments, solving for the equilibrium solution involves iteratively configuring operating parameters for the circuits while treating capacitors as open circuits and inductors as short circuits. For instance, some embodiments ramp the power supply voltages, vary temperatures, etc. to determine the set of parameters that achieve the equilibrium.

The process then performs an adaptive transient analysis. During transient analysis, some embodiments change the steady state quantities derived from the DC analysis to monitor the run-time behavior of the circuit based on a set of user specified input vectors. The process optimizes the transient analysis by solving only those regions at a particular time step of the analysis where an amount of state change for the regions from a previous time step exceeds a predefined threshold. In some embodiments, active regions represent regions to be solved or the regions with state change exceeding the threshold. In some embodiments, an active region at a particular time step is a region that has its inputs changing from a previous time step. In some embodiments, passive regions represent regions that are not to be solved or the regions with state change that does not exceed the threshold.

Specifically, the state change represents a variance in the state (e.g., voltages, residual currents, charge, etc.) between successive time points at the various nodes of a region. When the variance for all nodes or a set of nodes in a region fall below the threshold, then the region is deemed passive (or not active) and is not solved at that time step. When the variance for at least one node or a set of nodes in a region exceeds the threshold, then the region is deemed active and a solver is adaptively applied to solve the region based on the amount of variance. Accordingly, the process identifies (at 240) the regions as active regions and passive regions at each time step of the analysis.

Next, the process adaptively identifies (at 250) a simulation engine that implements a solving algorithm for each active region based on one or more criteria associated with each region. For instance, some embodiments partition the design to form linear regions and non-linear regions and adaptively apply one or more linear solvers to solve the active linear regions and one or more non-linear solvers to solve the non-linear regions. Linear regions include linear devices, such as capacitors and inductors, for which a change in applied voltage produces a proportional change in current. Non-linear regions include non-linear devices, such as diodes and transistors, for which a change in applied voltage does not produce a proportional change in current. The mathematical models for the linear regions can then be solved more efficiently than the mathematical models for the non-linear regions. For instance, the solving algorithms may be applied directly to the mathematical models of the linear regions whereas the mathematical models for the non-linear regions must first be linearized before solving. Accordingly, the adaptive analysis for applying different solvers to different regions simplifies the overall circuit simulation without losing accuracy.

As noted above, some embodiments select optimized simulation engines for each region based on an amount of state change occurring at each active region at a current time step relative to a previous time step. For a lesser amount of variance, some embodiments select a less accurate but faster simulation engine to solve and simulate the active region (e.g., a relaxation based timing simulation). For a greater amount of variance, some embodiments select a more accurate and thus more time consuming simulation engine to solve and simulate the active region (e.g., linearizing sets of non-linear equations and then applying a linear solver to iteratively compute the solution). In some embodiments, the computed amount of variance is compared against one or more specified threshold values where one of the threshold values includes a baseline threshold value for determining if a region is active or passive and other threshold values for selecting different solving algorithms. In some embodiments, the computation for determining the amount of variance is the same as the computation for determining the active or passive state of a region.

In some embodiments, the process adaptively determines the manner by which to simulate a region based on the amount of state change occurring at the region. In some embodiments, the amount of state change is compared against one or more thresholds in order to determine whether to simulate a region (1) without including fan-in ports and fan-out ports of neighboring regions into the active region, (2) uni-directionally by including either one or more fan-in ports or one or more fan-out ports of a neighboring region into the active region, or (3) bi-directionally by including one or more fan-in ports and one or more fan-out ports into the active region. Additionally, some embodiments adaptively determine the number of fan-in ports and/or fan-out ports to include when performing the simulation analysis. In this manner, some embodiments increase the accuracy of the simulation by accounting for dependencies between the various regions.

The process then solves (at 260) the active regions at each time step of the transient analysis using the optimized simulation engine that was adaptively identified for each such region at each time step of the analysis. In some embodiments, the resulting solution generates an output response specific to input stimuli provided by a user. The output response can then be used to verify circuit operation at the transistor level before committing the design to IC fabrication.

A circuit design that has been verified using the adaptive simulation of some embodiments can then be used to manufacture an IC. Additionally, designers or the simulation can iteratively adjust operating and/or gate parameters until constraints are met or the circuit design is better optimized. In some embodiments, the resulting simulation thus accounts for user specified control information. The control information may include analysis specific information such as accuracy tolerances, list of output response to be generated, length of simulation, etc.

In some embodiments, the process 200 occurs in real-time whereby the process automatically adapts to circuit conditions occurring at each region at each time step of the analysis. Specifically, the process speeds up (computes fewer timepoints for lesser accuracy) to take advantage of circuit latencies as these occur and slows down (computes more timepoints for greater accuracy) appropriately as circuit activity requires.

Several more detailed embodiments of the invention are described in the sections below. Section II provides a system architecture used by some embodiments to implement the real-time adaptive simulation. Next, Section III describes several embodiments for the real-time adaptive simulation in accordance with some embodiments of the invention. Lastly, Section IV provides a description of a computer system with which some embodiments of the invention are implemented.

II. System Architecture

Figure 3:
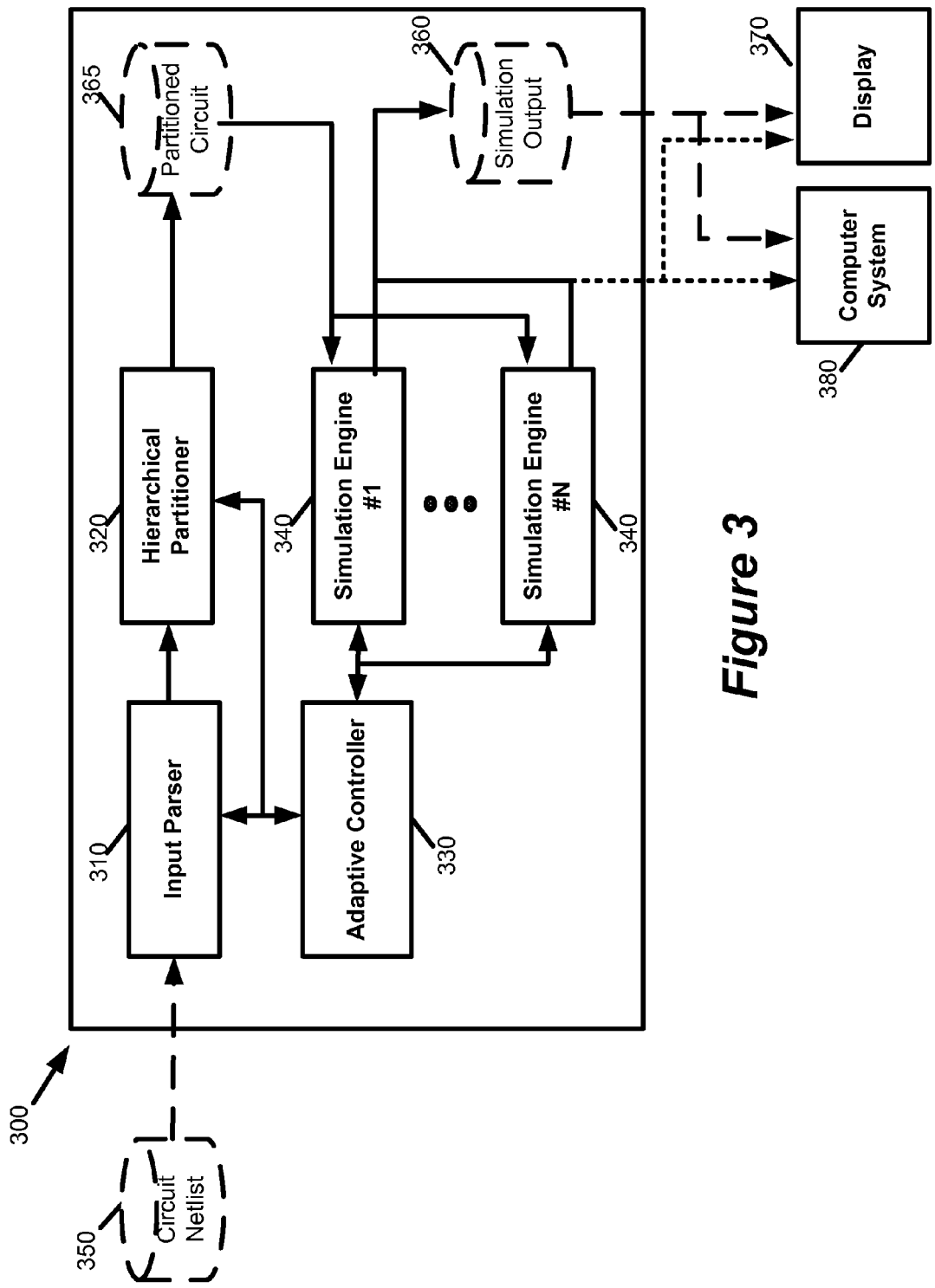
FIG. 3 presents a system architecture for a circuit verification tool of some embodiments that is implemented by one or more electronic or computing devices to perform the real-time adaptive simulation.

FIG. 3 presents a system architecture for a circuit verification tool 300 of some embodiments that is implemented by one or more electronic or computing devices to perform the real-time adaptive simulation. As shown, the circuit verification tool 300 includes: (1) an input parser 310, (2) a hierarchical partitioner 320, (3) an adaptive controller 330, (4) one or more simulation engines 340 for different simulation modes, (5) storage databases 360 and 365 for storing outputs of the simulation engines 340 for subsequent display on a display device 370 or for additional processing by the system 300 or other computer systems 380.

The input parser 310 receives a circuit netlist 350 as input. The circuit netlist 350 describes the circuit elements (e.g., transistors, resistors, capacitors, inductors, diodes, etc.) of the IC design and their connections. In some embodiments, the circuit netlist 350 includes only analog circuits, only digital circuits, or a combination of both analog circuits and digital circuits (i.e., mixed-signal design). In some embodiments, the netlist 350 also contains device models, input stimuli, and simulation control information.

It is the role of the input parser 310 to read the circuit netlist 350 and convert the netlist into internal data structures. The input parser 310 of some embodiments is able to read in and convert multiple different netlist formats (e.g., SPICE, Verilog, Spectre, etc.) into the single internal data structure format. In some embodiments, these internal data structures include topological graphs of devices and nodes to define the connectivity between the devices, nodes, or both.

The hierarchical partitioner 320 performs the partitioning by dividing the design into loosely-coupled partitions. Each partition is a topological representation (e.g., device types and their connectivity) of strongly coupled devices. Partitions bigger than a user specified threshold are further divided into a bordered block diagonal (BBD) format.

Figure 4:
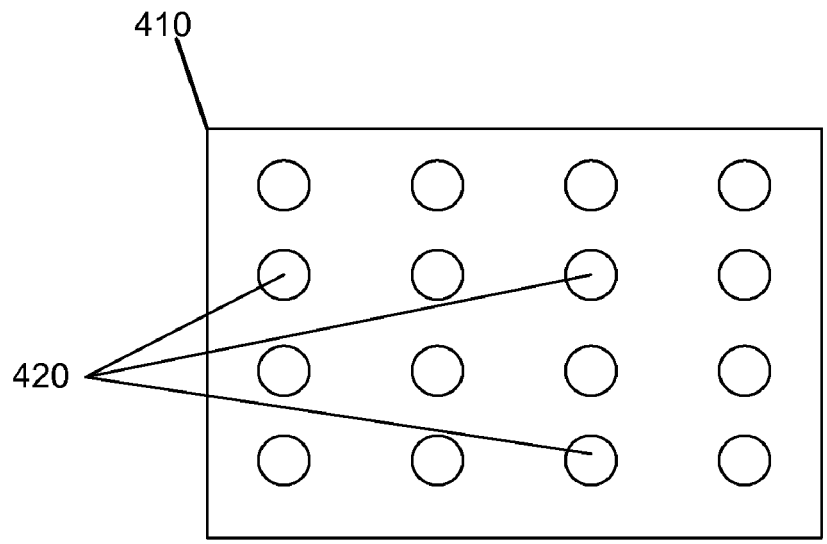
FIG. 4 conceptually illustrates an IC design with several circuit elements.
Figure 5:
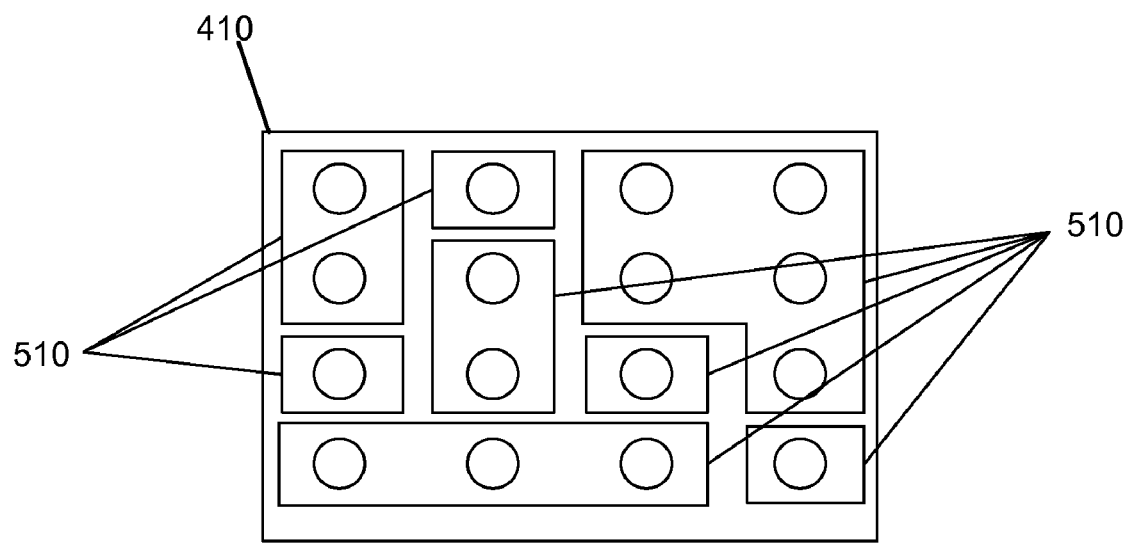
FIG. 5 conceptually illustrates the IC design of FIG. 4 after the hierarchical partitioner of some embodiments partitions the design into several regions.

FIG. 4 conceptually illustrates an IC design 410 with several circuit elements 420. FIG. 5 conceptually illustrates the IC design 410 of FIG. 4 after the hierarchical partitioner 320 of some embodiments partitions the design into several regions 510. The hierarchical partitioner 320 partitions the design based on one or more criteria.

In some embodiments, the criteria include identifying and forming linear regions and non-linear regions. As noted above, the linear regions include linear devices, such as capacitors and inductors, for which a change in applied voltage produces a proportional change in current and the non-linear regions include non-linear devices, such as diodes and transistors, for which a change in applied voltage does not produce a proportional change in current. It should be apparent to one of ordinary skill in the art that any such criteria may be used to form different partitioned regions of the design to facilitate the efficient simulation of the design. Further details on partitioning the design in accordance with some embodiments of the invention (e.g., forming linear and non-linear regions) are described in the U.S. patent application with Ser. No. 11/532,898, filed on Sep. 18, 2006, now issued as U.S. Pat. No. 7,555,733, entitled "Hierarchical Partitioning".

Figure 6:
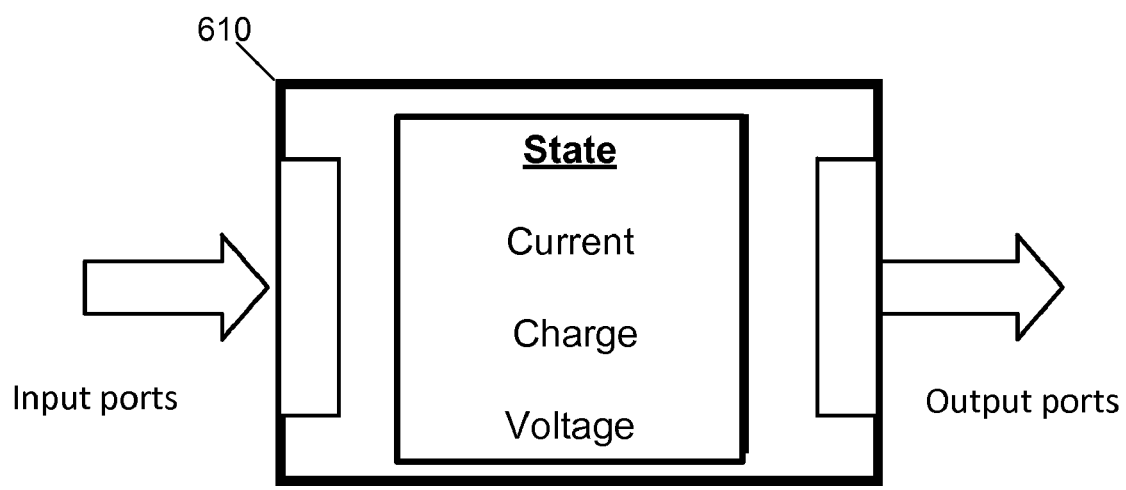
FIG. 6 conceptually illustrates a partitioned region in accordance with some embodiments.

FIG. 6 conceptually illustrates a partitioned region 610 in accordance with some embodiments. The region 610 contains (1) topological information, such as the partition information, the circuit elements of the regions, the various interconnections between the circuit elements, and (2) electrical state information, such the states of the various elements including current, charge, voltage, resistance, etc.

Figure 7:
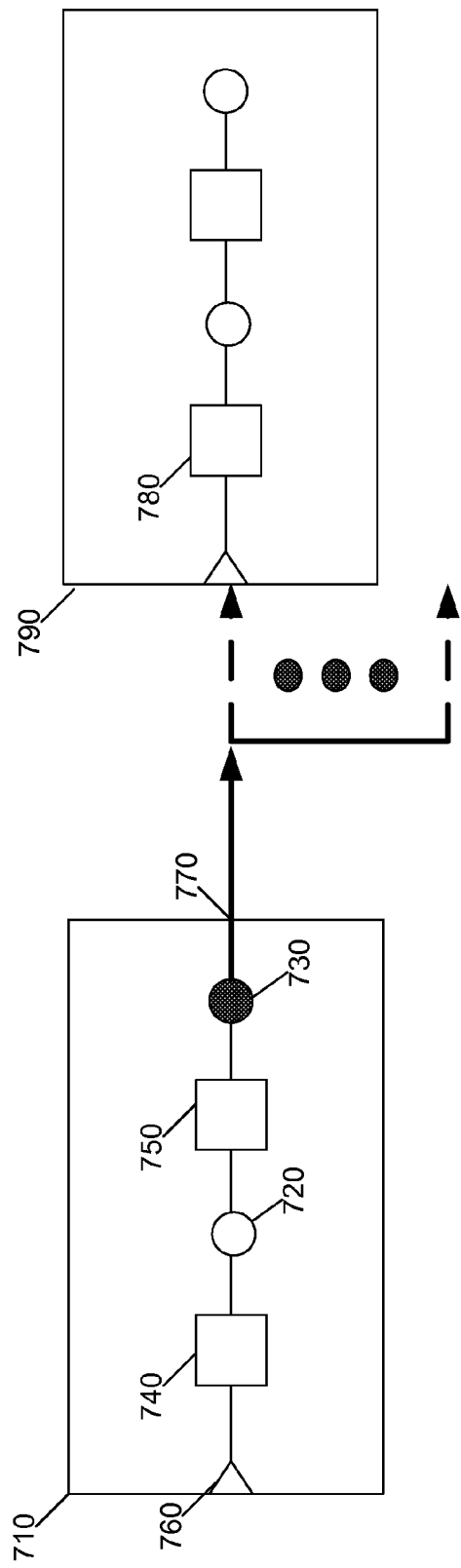
FIG. 7 presents a detailed representation of a partitioned region to illustrate topological information contained within the region in accordance with some embodiments.

FIG. 7 presents a detailed representation of a partitioned region 710 to illustrate topological information contained within the region in accordance with some embodiments. The region 710 includes nodes 720 and 730, devices 740 and 750, at least one fan-in port 760, and at least one fan-out port 770. Each of the nodes 720 and 730 is a connection of one or more device terminals. In some embodiments, a device terminal connects to a single node. Node 720 is referred to as an internal node since all the devices 740 and 750 connected to node 720 belong to the same region 710. Node 730 is referred to as a fan-out node since a device 780 connected to node 730 belongs to another region 790. The region 790 of the connected device is referred to as a fan-out region.

There can be any number of fan-out regions connected to a node. The parent region of the fan-out node is called a fan-in region to the fan-out region. The terminal of the device in the fan-out region connected to a fan-out node is called a fan-in port. The same terminal from the fan-in region is called a fan-out port. A fan-in port can only connect to a single fan-out port. However, a fan-out port can connect to any number of fan-in ports. For example, in FIG. 7, the two regions 710 and 790 are connected together. Devices 740 and 750 are connected to internal node 720. Node 730 is connected to devices 750 and 780. The device terminal 780 is labeled fan-in port in region 790 and a fan-out port in region 710.

The state of a region is defined in terms of its nodes and device attributes computed during simulation. The node attributes include charge, residual current, and voltage. The device attributes include terminal currents, charges, and voltages. Accordingly, the state of the region is represented in terms of the change in the state (e.g., voltages, residual currents, and charge) at each node of the region between successive time points.

In some embodiments, the input parser 310 models a region in terms of equations based on Kirchhoff's current laws (i.e., KCL equations) and equations in terms of Kirchhoff's voltage laws (i.e., KVL equations). The circuits of the region are modeled as a set of coupled nonlinear ordinary differential equations (ODE).

Figure 8:
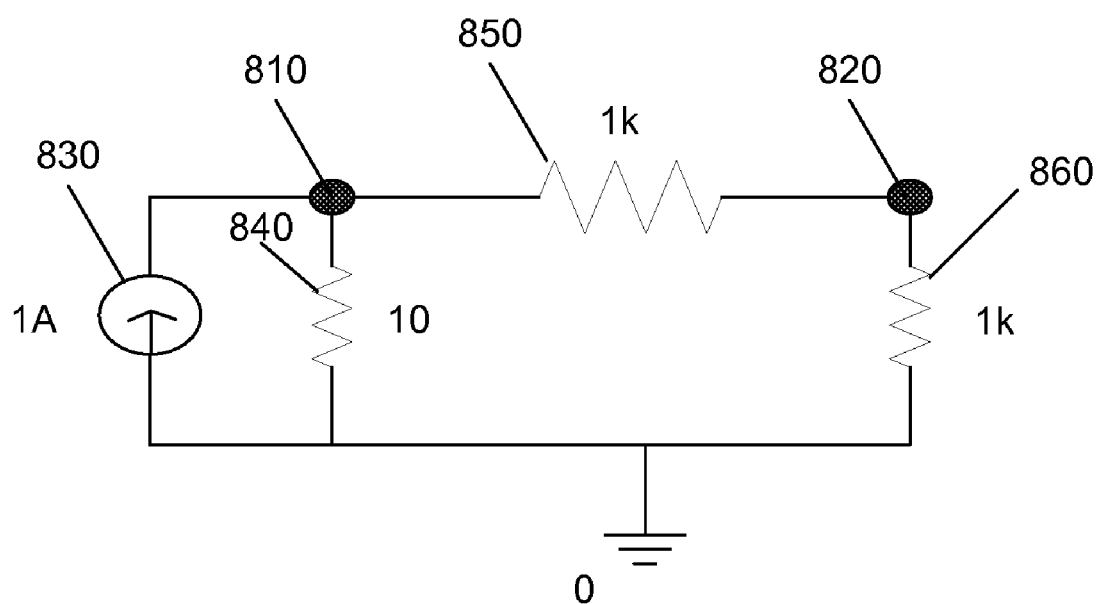
FIG. 8 presents an example for modeling a region that includes a simple circuit.

FIG. 8 presents an example for modeling a region that includes a simple circuit. It should be apparent to one of ordinary skill in the art that this figure is meant for exemplary purposes and that the actual regions partitioned by some embodiments may include regions with any arbitrary structure, number of nodes, number of devices, etc. In this example, the region includes nodes 810 and 820 and various devices including a current source 830, a first resistor 840, a second resistor 850, and a third resistor 860. The nodes 810 and 820 are mathematically modeled according to KCL equations (1) and (2) below:

$$-Is+(V1/R1)+((V1-V2)/R2)=0 \quad (1)$$

$$((V2-V1)/R2)+(V2/R3)=0 \quad (2)$$

where Is represents a value of the current source 830, R1 represents the impedance at the first resistor 840, R2 represents the impedance at the second resistor 850, R3 represents the impedance at the third resistor 860, V1 represents the voltage at node 810, and V2 represents the voltage at node 820.

The equations can then be solved to determine the solution vector for the devices. First, the equations are organized in terms of the voltages:

$$((1/R1)+(1/R2))*V1+((1/R2))*V2=Is \quad (3)$$

$$(-(1/R2))*V1+((1/R2)+(1/R3))*V2=0 \quad (4)$$

Equations (3) and (4) are then represented as system matrices (5). The system matrices (5) are simplified in terms of total conductances (e.g., G11 through G22) and source currents (e.g., I1 and I2) as shown in matrices (6):

$$\begin{bmatrix} \frac{1}{R1}+\frac{1}{R2} & -\frac{1}{R2} \\ -\frac{1}{R2} & \frac{1}{R2}+\frac{1}{R3} \end{bmatrix} \times \begin{bmatrix} V_1 \\ V_2 \end{bmatrix} = \begin{bmatrix} Is \\ 0 \end{bmatrix} \quad (5)$$

$$\begin{bmatrix} G_{11} & G_{12} \\ G_{21} & G_{22} \end{bmatrix} \times \begin{bmatrix} V_1 \\ V_2 \end{bmatrix} = \begin{bmatrix} I_1 \\ I_2 \end{bmatrix} \quad (6)$$

The system matrices can then be iteratively solved using one or more different matrix solvers. For example, the solution for the matrices (5) return voltage values 9.9525 for node 810 and 4.975 for node 820 and current values of 0.995025 A through resistor 840, and 4.975 mA through resistors 850 and 860.

To perform the modeling of the regions, some embodiments utilize a Modified Nodal Analysis (MNA) technique. The MNA technique translates the internal devices, input and output ports of the regions into the set of KCL and KVL equations. The MNA technique proceeds by:

(1) identifying all nodes in a region,
(2) selecting a reference node from the identified nodes (e.g., ground),
(3) assigning a value to the current through each current source of the region,
(4) applying Kirchhoff's current law (KCL) to each node,
(5) writing an equation for the voltage of each voltage source (i.e., applying KVL), and
(6) using the reference node, solving for the system of unknowns (e.g., the other nodes in the region).

Figure 9:
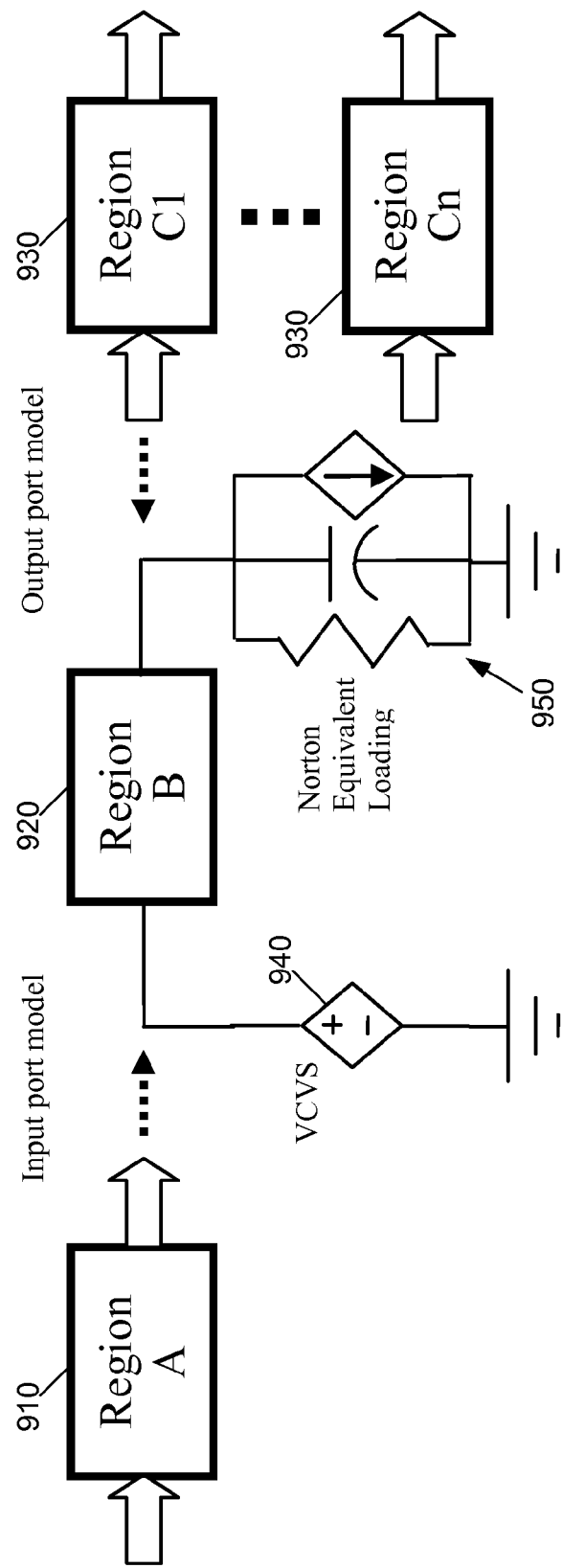
FIG. 9 presents a conceptual model for a partitioned region of some embodiments.

FIG. 9 presents a conceptual model for a partitioned region of some embodiments. As shown, an input port of a region 920 is modeled as a voltage controlled voltage source (VCVS) 940. The electrical loading at a fan-out node is added as a Norton equivalent model that is computed from all the connected fan-out ports. A Norton equivalent model 950 includes an impedance and a Norton current source. For example, region 910 is a fan-in region to region 920 and region 920 is the fan-in region to region 930. Similarly, region 920 is the fan-out region of region 910 and the one or more regions 930 are fan-out regions of region 920. The VCVS voltage 940 at the fan-in port of region 920 is same as the controlling voltage of the fan-out node in region 910. The Norton equivalent model at the fan-out node in region 920 is computed from all the fan-out regions.

The equations derived from the MNA models are solved, as will be further described below, to determine the state of the circuits under specific bias conditions. Various analyses are developed to understand the behavior of a circuit by analyzing the state under different conditions. Some such analyses include DC analysis and transient analysis. In DC analysis, some embodiments solve the model to find the quiescent state of the circuits. In transient analysis, some embodiments solve the model to compute the state of the circuits at a series of ascending time-points. Specifically, transient analysis utilizes the collection of operational parameters identified during DC analysis to find a time response of the circuit based on an arbitrary input waveform.

With the regions partitioned and modeled, the adaptive controller 330 identifies the active regions and the passive regions. To identify the regions, the adaptive controller 330 computes an amount of state change for each of the regions at various time steps of the simulation analysis. In some embodiments, the state of a region is defined as a set of voltage, residual current, and total charge at each node in the region. In some embodiments, the change in the state at a node between different time steps (Ti and Tj) of the transient analysis is defined using one or more of the following equations (7)-(13):

$$\Delta V < \mu V \quad (7)$$

$$\Delta I < \mu I \quad (8)$$

$$\Delta Q < \mu Q \quad (9)$$

$$\Delta V < (\text{Max}(|Vi|,|Vj|) \cdot \rho V + \alpha V) \quad (10)$$

$$\Delta I < (\text{Max}(|Ii|,|Ij|) \cdot \rho Q + \alpha Q) \quad (11)$$

$$\Delta Q < (\text{Max}(|Qi|,|Qj|) \cdot \rho Q + \alpha Q) \quad (12)$$

$$\Delta V/\Delta T < \alpha T \quad (13)$$

In the equations (7)-(13) above, Ti and Tj represent a simulation time at time points i and j, Vi and Vj represent voltages at a node at time Ti and Tj, Ii and Ij represent residual currents at a node at time Ti and Tj, Qi and Qj represent total charges at a node at time Ti and Tj, $\Delta V=|Vi-Vj|$ represents absolute difference in node voltage at time Ti and Tj, $\Delta I=|Ii-Ij|$ represents absolute difference in residual current at a node at time Ti and Tj, $\Delta Q=|Qi-Qj|$ represents absolute difference in total charge at a node at time Ti and Tj, $\Delta V/\Delta T$ represent rate of change of voltage difference at a node at time Ti and Tj, μV represents user specified maximum voltage change error tolerance, μI represents user specified maximum residual current change error tolerance, μQ represents user specified maximum total charge change error tolerance, ρV represents user specified relative voltage error tolerance, ρI represents user specified relative residual current error tolerance, ρQ represents user specified relative total charge error tolerance, αV represents user specified absolute voltage error tolerance, αI represents user specified absolute residual current error tolerance, αQ represents user specified absolute total charge error tolerance, and αT represents user specified rate of change of voltage error tolerance. A region is classified as active when any of the above mentioned conditions is false, otherwise the region is classified as passive. It should be apparent to one of ordinary skill in the art that equations (7)-(13) present several examples by which to identify active regions from passive regions and that other possible equations may be used in conjunction with or instead of equations (7)-(13) to further enhance or simplify the identification of the active regions from the passive regions.

The adaptive controller then adaptively identifies an optimal simulation engine for each active region of the design in real-time based on the amount of state change. Such real-time adaptive analysis allows the simulation performed by some embodiments to speed up (e.g., compute fewer time-points) to take advantage of circuit latencies as these occur and slow down (e.g., compute more time-points) appropriately as circuit activity requires.

Additionally, by partitioning the circuit into multiple, loosely coupled sub-circuits the problem of solving a single circuit matrix is modified to that of solving many smaller matrices. This greatly increases the adaptive controller's capability to handle large mixed-signal circuits. In order to maintain accuracy with this approach, the adaptive controller of some embodiments performs full accuracy analysis (e.g., SPICE-like analysis) for each partition and a rigorous analysis of the boundary conditions for each partition, so that no charge leakage occurs and charge is conserved. Such analysis is described in further detail below with reference to FIG. 20-22.

The real-time functionality of the adaptive controller 330 is automatic such that designer intervention or judgment is not needed as the analytical techniques are built into the simulator. By using this approach, such a simulator can automatically deliver full accuracy and yet handle large-scale mixed-signal circuits by adaptively tuning the simulation to account for region with different states, state transitions, etc. As a result, some embodiments are able to handle designs that 50 time larger than what traditional SPICE simulators can handle, while concurrently providing an average of a factor of 50 speed improvement with full SPICE-like accuracy.

Figure 17:
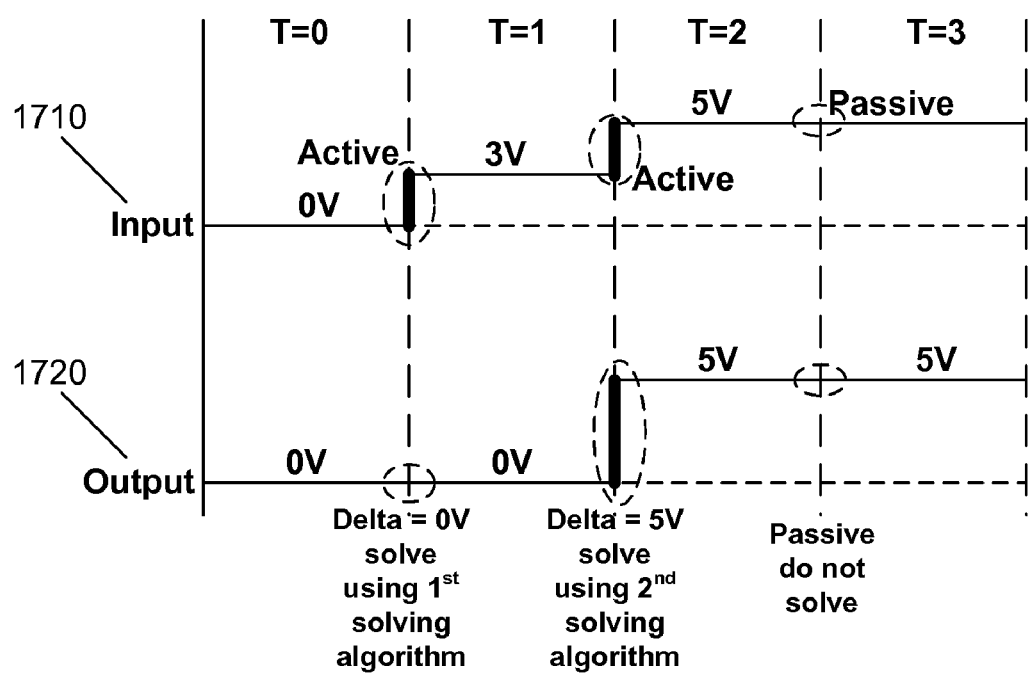
FIG. 17 conceptually illustrates the adaptive selection of different solvers that is performed by some embodiments based on different state changes occurring at a particular active region over multiple time steps.

The real-time analysis performed by the adaptive controller 330 of some embodiments includes monitoring the state and the rate of change in the state of the circuits for each region at each stage of analysis. Based on the monitored states and the changes in the states, the adaptive controller 330 automatically selects and adaptively applies one or more of the various engines 340 to optimally simulate each region to achieve the highest possible accuracy in the shortest amount of time. FIG. 17 below presents an example of the adaptive controller 330 automatically selecting and adaptively applying one or more of the various engines 340 to various regions based on monitored states and changing in the states of the regions. Such analysis occurs in real-time as these operations are performed automatically by the adaptive controller 330 without requiring user intervention or user interaction.

In some embodiments, the adaptive controller 330 dynamically determines whether to solve a region (e.g., active or passive) and which simulation engine to select to solve a region by comparing the states changes of the region to a specified threshold. The engines 340 are different sets of simulation solvers that generate the output of some embodiments. The outputs are produced based on a set of user specified inputs and include measurement reports 360 that are used by designers to verify the design and modify the design if needed. In some embodiments, these outputs provide the results of the simulation. It should be apparent to one of ordinary skill in the art that in some embodiments the outputs are represented in the form of simulated transient waveforms. Accordingly, some embodiments provide extremely fast simulators with the ability to handle full chip capacity of millions of elements. Additionally, for sensitive analog and mixed-signal circuits, such as SerDes (Serilizer/Deserializer), high digital content data converters, and the like, some embodiments deliver speed and capacity at full accuracy.

Several embodiments for real-time adaptive circuit simulation will now be described. It should be apparent to one of ordinary skill in the art that some embodiments perform some or all such adaptive simulation optimization techniques when simulating a circuit design. Additionally, other optimization techniques may also utilized in conjunction with the embodiments below to further improve the performance of the circuit simulation.

III. Real-Time Adaptive Circuit Simulation

Some embodiments perform circuit simulation using a real-time adaptive simulation technique that maintains circuit simulation accuracy while providing timing simulation speed. In some embodiments, the real-time adaptive simulation is an automatic dynamic-mixed-mode simulation that automatically selects and applies different simulation engines to different partitions of a design during simulation.

Figure 10:
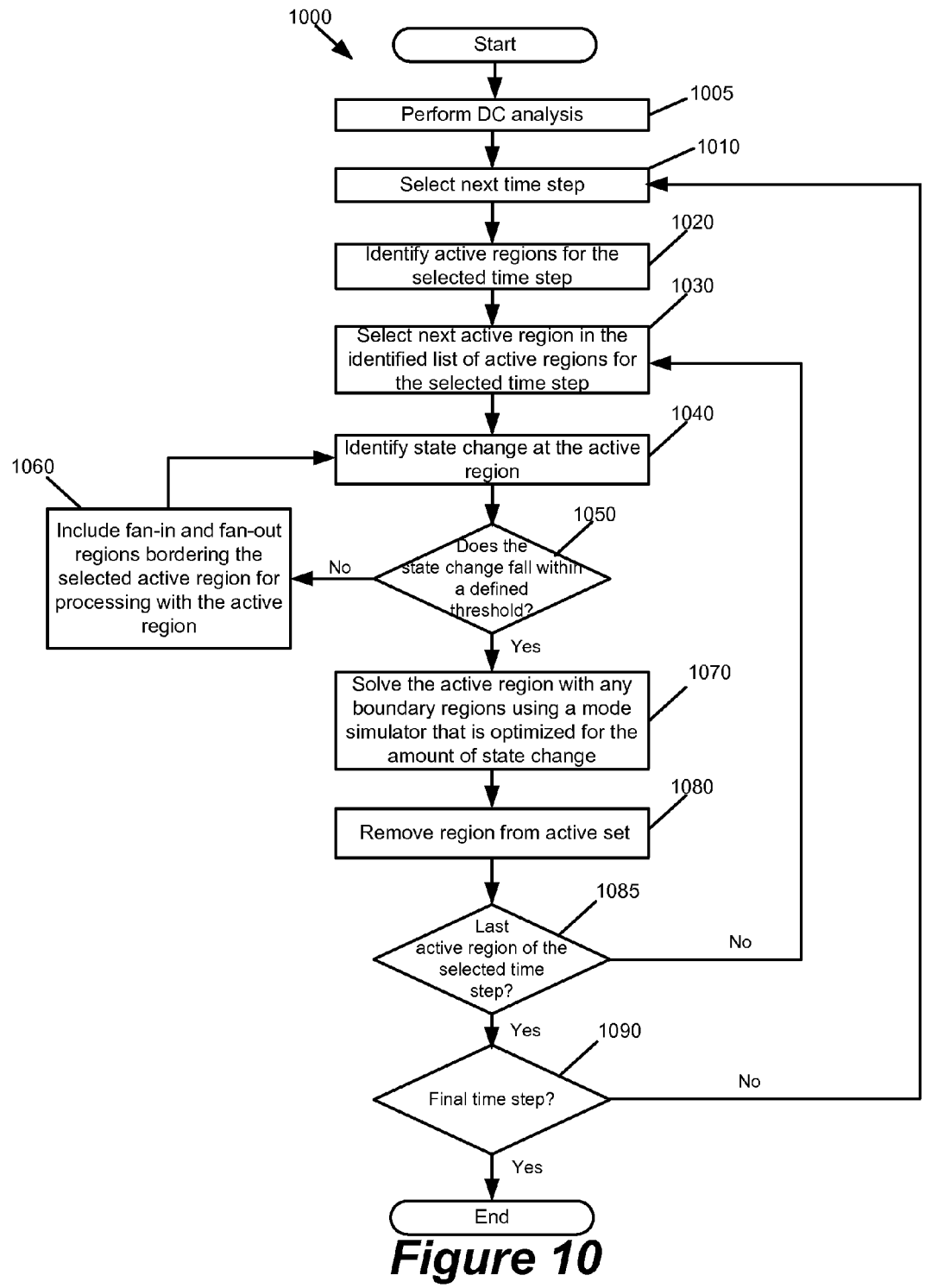
FIG. 10 presents a process implemented by the adaptive controller to perform the real-time adaptive circuit simulation of some embodiments.

FIG. 10 presents a process 1000 implemented by the adaptive controller to perform the real-time adaptive circuit simulation of some embodiments. The process 1000 begins by performing (at 1005) an adaptive simulation for the DC analysis of a circuit design. The DC analysis determines the quiescent state of the design for a given set of input stimuli at time zero. The adaptive simulation of some embodiments for the DC analysis is further described below in Subsection A.

Once DC analysis is complete, the process performs an adaptive simulation for the transient analysis of the circuit design. The process selects (at 1010) a time step of the transient analysis. The process identifies (at 1020) regions that are active at the selected time step as described further below with reference to FIG. 12. These regions include regions where the inputs have changed from the previous time step. As such, a region that was passive during a first time step may become active at a second time step and vice versa. The process then selects (at 1030) an active region for processing. In this manner, the process avoids processing those regions that are inactive or passive. This allows some embodiments to improve the speed of the simulation by exploiting latency in the design.

By comparing (at 1050) the amount of the identified state change to a specified threshold, some embodiments determine whether to solve the region (e.g., active or passive) and whether additional information is needed to properly simulate the region. A region is active when any of the above mentioned conditions in equations (7)-(13) is false, otherwise the region is passive. When additional information is needed, the process includes (at 1060) additional information from the fan-in and fan-out regions to the active region. The additional information facilitates determining the cause for the state change at the active region. The expanded active region is then reanalyzed at steps 1040 and 1050 to determine whether sufficient information exists for solving the simulation.

When sufficient information is included within the active region, the process solves (at 1070) the region using a simulation engine that is optimized for the amount of state change experienced by the active region. The process utilizes a simulation engine with greater accuracy when the state change is large. Conversely, the process utilizes a simulation engine with less accuracy but with quicker response time when the state change is small. The solved region is then removed (at 1080) from the set of active regions.

The process performs steps 1030-1080 for all active regions identified in the current time step. After determining (at 1085) that all such regions have been simulated, the process determines (at 1090) whether all time steps have been analyzed for the transient analysis. When additional time steps remain, the process returns to step 1010 to select the next time step and solve all active regions for that time step. When no additional time steps remain, the process terminates.

A. Adaptive Simulation: DC Analysis

The adaptive controller of some embodiments performs the DC analysis of a circuit design through an adaptive simulation that implements a levelized DC analysis algorithm. The levelized DC analysis of some embodiments computes the DC state for each partitioned region using a set of matrices with each matrix modeling each of region independently. In this manner, some embodiments avoid performing DC analysis like conventional simulators which utilize a large single system matrix to model and solve the steady state for the entire circuit design. Specifically, the levelized DC analysis of some embodiments determines the DC state of the circuit design by evaluating each partitioned region in a levelized sequence starting from the primary inputs of the design. In some embodiments, the primary inputs are specified by a user at the time the circuit netlist is received by the input parser.

Regions are classified as either input regions or leaf regions. An input region includes devices with a known state (e.g., voltage sources, etc.). A leaf is a region where the state needs to be computed at a particular time-point.

In some embodiments, all regions in a circuit design are levelized according to the flow for signals from the primary inputs to output nodes. Some embodiments perform the levelization by assigning level-0 to all input regions. Some embodiments then label each region based on the largest level of its fan-in regions. All regions in a feedback loop are grouped in a feedback region and are considered at the same level.

Figure 11:
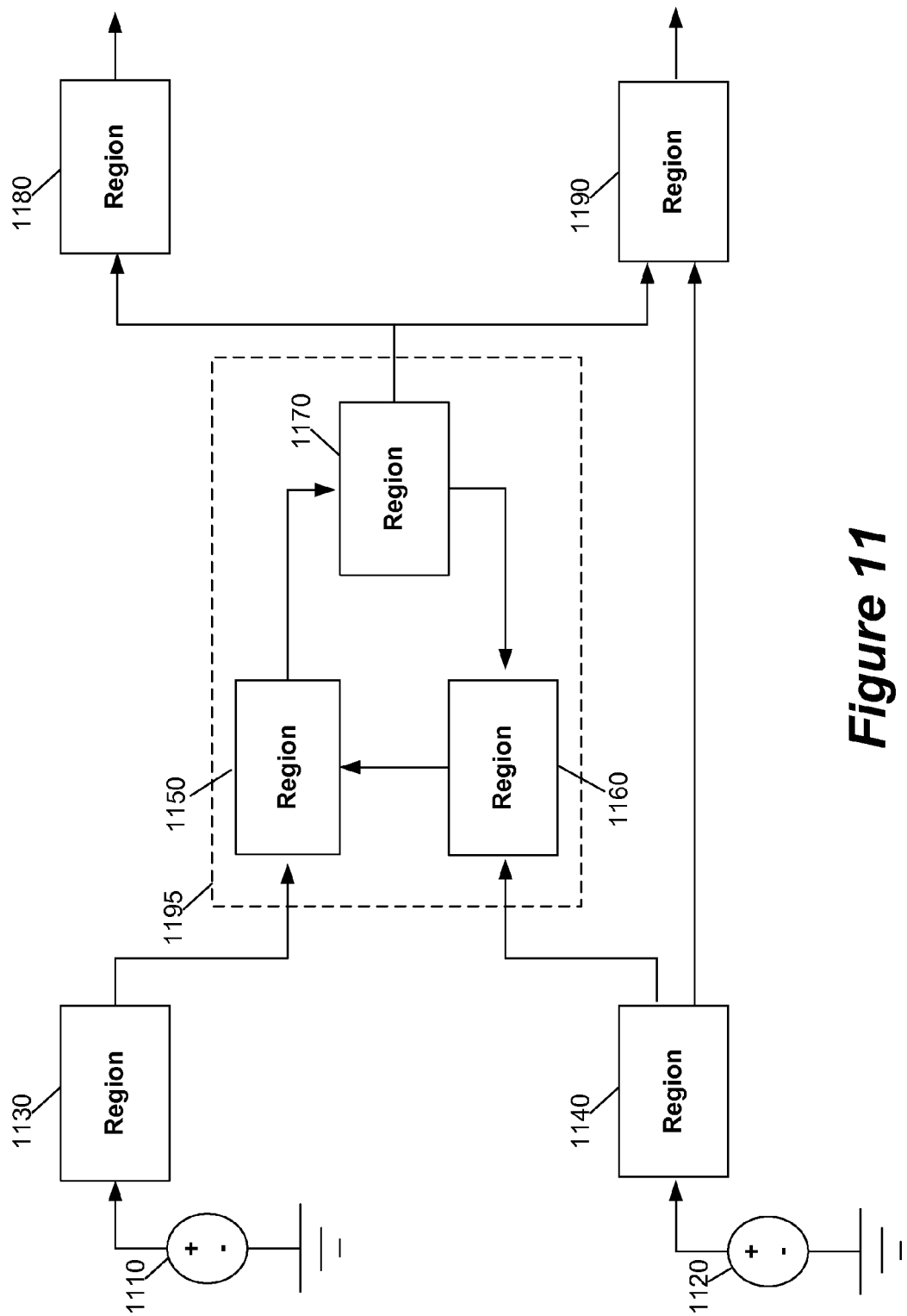
FIG. 11 conceptually illustrates levelization of a region.

FIG. 11 conceptually illustrates levelization of a region. In this figure, there are two input regions, 1110 and 1120, and there are seven leaf regions, 1130, 1140, 1150, 1160, 1170, 1180, and 1190. Both input regions 1110 and 1120 are at level-0. Region 1130 has only one fan-in, 1110, resulting in a level-1 designation. Similarly, region 1140 is also at level-1. Regions 1150, 1170, and 1160 belong to a single feedback region 1195 and are all assigned a level-2 designation. Regions 1180 is at a level-3 designation. Region 1190 has two fan-in regions, 1140 and 1170, the largest fan-in region level is level-2, resulting in the region being assigned a level-3.

DC solution of a region is computed by solving Modified Nodal Analysis (MNA) equations using various algorithms. In some embodiments, the first DC algorithm used is the damped Newton-Raphson. In case, the Newton-Raphson fails to converge a series of homotopy based algorithms (e.g., voltage-stepping, GMin-stepping, GShunt-stepping) are applied. If all homotopy algorithms fail to converge, a damped pseudo-transient algorithm is used to compute a valid DC solution. Through this levelized approach, homotopy algorithms are applied only to the matrices of regions that have difficulty in convergence whereas traditional circuit simulators apply the homotopy algorithms to a full system matrix even if only a part of the circuit design is non-convergent. In this manner, some embodiments are able to resolve DC analysis faster than the conventional DC analysis simulators (e.g., SPICE).

Adaptive DC solution starts by scheduling all input regions in a DC evaluation-queue. A region is ready to be scheduled if all of its fan-in regions have a valid DC state. The region at the top of the queue is popped out of the queue to be evaluated by the DC algorithm as described in the previous paragraph. Once a valid DC solution for the region is found, all fan-out regions are tested if they are ready to be scheduled in the evaluation-queue. In case the fan-out region belongs to a feedback region, all regions in the feedback loop are scheduled in the queue provided all fan-in regions have a valid DC state. The process is repeated until all regions are evaluated.

B. Adaptive Simulation: Transient Analysis

After a valid DC solution is determined, some embodiments perform an adaptive transient analysis of the circuit design. Some embodiments perform the adaptive transient analysis by solving states of the various partitioned regions of the circuit design over a series of ascending time-points. Some embodiments utilize a Local Truncation Error (LTE) algorithm to control and identify the number of time steps or time-points and to ensure that accuracy of the simulation is within user specified tolerances.

In a conventional circuit simulation, the state of the complete circuit is computed at each time step. A system of KCL and KVL equations is created from the device models. The ODE model is solved using either a direct or a decomposition method.

In the adaptive transient analysis of some embodiments, the circuit-state is a composite of the states of individual regions. The state of a region is computed individually using its previous states and boundary conditions (i.e., the state of input and output ports). A region is evaluated using a number of different modes depending on various conditions. If the state of a region changes significantly, all the neighboring regions are re-evaluated. The process is repeated until all regions iteratively converge to a valid solution.

i. Active Regions and Passive Regions

Some embodiments classify the various regions as either passive (also called steady) or active (also called transitioning) based upon the change in the states of the regions. A region is passive if the change in the state between consecutive time-points is less than a specific threshold, otherwise it is deemed active. Some embodiments optimize transient analysis by simulating only active regions at each time step without simulating passive regions. In this manner, some embodiments are able to allocate more accurate and time consuming simulation engines to only parts of the circuit design (e.g., active regions) while reducing the overall simulation burden by foregoing analysis of the passive regions.

Figure 12:
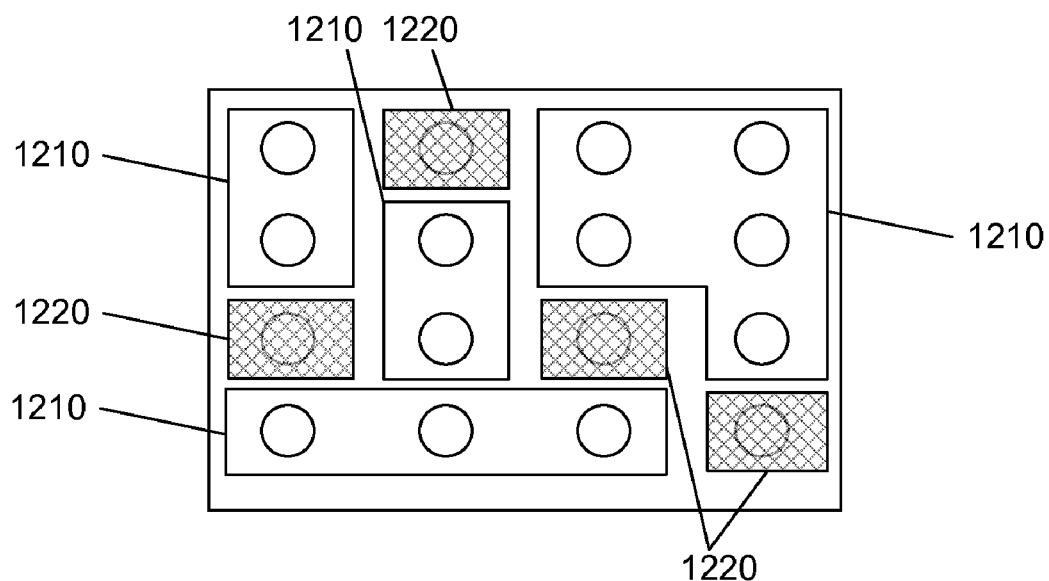
FIG. 12 conceptually illustrates identifying partitioned regions of a circuit design as active regions and passive regions in accordance with some embodiments.

FIG. 12 conceptually illustrates identifying partitioned regions of a circuit design as active regions and passive regions in accordance with some embodiments. As shown, the design is partitioned into several regions 1210 and 1220. As noted above, some embodiments form the regions by grouping sets of linear devices into one or more regions and by grouping sets of non-linear devices into one or more regions.

During each step of transient analysis, the regions are analyzed to determine which regions are active and which regions are passive. As mentioned above, a passive region represents a region where the state of the region does not change beyond a predefined threshold from one time step to another. Otherwise, the region is classified as being active and should be solved. Some embodiments quickly identify passive regions by determining whether the inputs to the region change from one time step of the transient analysis to the next time step. If there is no change in the inputs then some embodiments classify the region as passive.

Some embodiments also exploit modularity within the design to designate regions as passive. Modularity occurs when a repeating pattern of input stimuli or repeating behavior occurs at a region. By identifying such repeating patterns or behavior, some embodiment reuse previously produced solutions for the region without having to reanalyze and recompute the solution in order to simulate the region. Therefore, even though inputs to a region change from time step to time step, the region may be designated as passive if a modular trend is detected at the region.

For example, modularity may occur within memory circuits that include a large number of bit-cells with each bit-cell storing either a 0 or a 1 state. At any given time step, a large number of bits of a particular memory circuit are steady at either 0 or 1, (i.e., have the same state), and only a small number of bit-cells may be transitioning from one state to another. Some embodiments exploit the modularity by sharing the state of bit-cells with the same value (e.g., not simulating a bit-cell if its state matches with another bit-cell that is already simulated at that time point).

Some embodiments detect modularity by creating a signature, such as a hash value, of the entire state of a region including the state of fan-in ports and fan-out ports of the region at a particular time. The signature and the state are saved in a searchable map. During simulation, if there is a signature match between two regions indicating a possible shared state, modularity is verified by comparing the complete state of the regions. If a match is found, then the state from the first region can be shared by the second region without performing any simulation. By leveraging such modularity to avoid recomputing the solution for these regions, some embodiments achieve efficiency gains that cause the simulation to occur faster than existing circuit simulation without loss of accuracy.

Therefore, by exploiting latency and modularity within the design, some embodiments avoid simulating passive regions thereby freeing computational resources to be used instead for the simulating of only the active regions. In this manner, some embodiments increase the accuracy of the simulations used for the active region, increase the supported design capacity, or increase the speed by which the simulation of the design occurs. As a result, some embodiments achieve increased orders of magnitude in speed over traditional circuit simulators while still achieving SPICE level accuracy.

Figure 13:
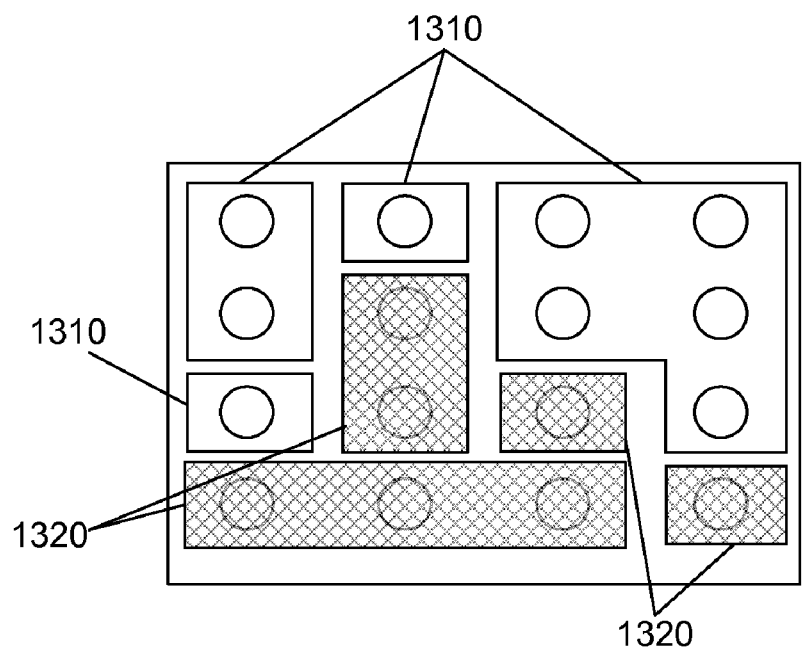
FIG. 13 illustrates the partitioned regions of FIG. 12 at a different time step than FIG. 12 where a different set of the regions are identified as active regions and a different set of the regions are identified as passive regions.

In FIG. 12, regions 1210 are identified as active regions and regions 1220 are identified as passive regions. It should be apparent to one of ordinary skill in the art that the set of active regions and passive regions may change at each time step of the transient analysis. For example, FIG. 13 illustrates the partitioned regions of FIG. 12 at a different time step than FIG. 12 where a different set of the regions 1310 are identified as active regions and a different set of the regions 1320 are identified as passive regions.

From this analysis, some embodiments generate a list of active regions at each time step of the transient analysis that are to be simulated. Some embodiments then adaptively simulate each of the regions using one or more simulation engines. At each time step, some embodiments use different simulation engines to simulate different active regions. Similarly, for the same active region at two different time steps, some embodiments use different simulation engines to simulate the region. In some embodiments, each simulation engine includes at least one solver algorithm.

ii. Linear Regions and Non-Linear Regions

Some embodiments adaptively select the simulation engine to be used for analysis of an active region based on one or more criteria. In some embodiments, linear solvers are used to separately simulate each of the active regions that include only linear devices and non-linear solvers are used to separately simulate each of the active regions that include only non-linear devices or a combination of linear devices and non-linear devices.

Such adaptive simulation increases the efficiency, accuracy, and capacity of the transient analysis performed by some embodiments as the less computationally intensive linear regions are differentiated from the more computationally intensive non-linear regions.

Figure 14:
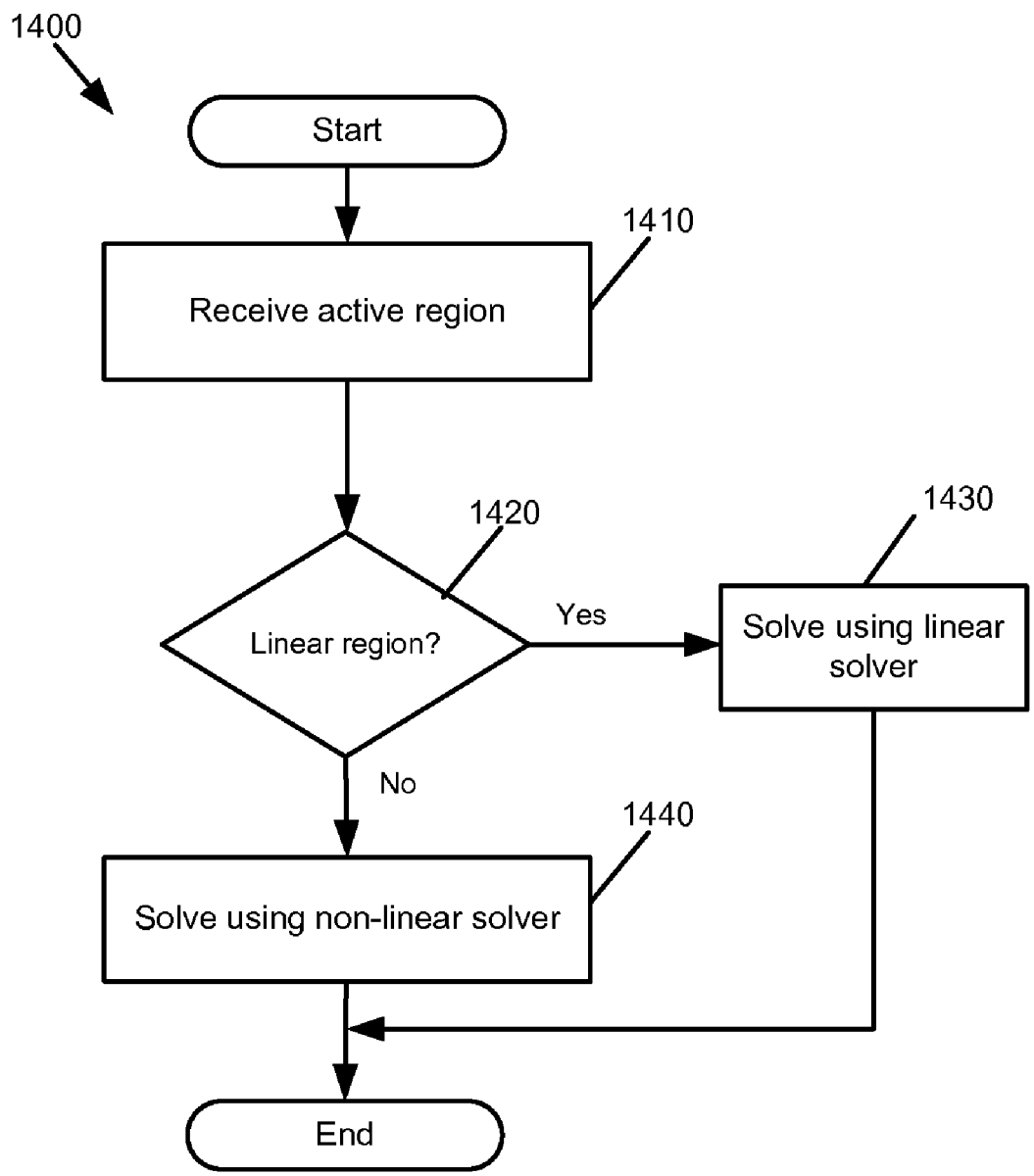
FIG. 14 presents a process that describes the adaptive use of linear solvers and non-linear solvers during a particular step of transient analysis performed by some embodiments.

FIG. 14 presents a process 1400 that describes the adaptive use of linear solvers and non-linear solvers during a particular step of transient analysis performed by some embodiments. The process 1400 begins by receiving (at 1410) an active region within the list of active regions identified for the particular step. Next, the process adaptively determines the appropriate solver to use to solve the region by determining (at 1420) whether the received region is a linear region or a non-linear region.

When the received region is a linear region, the process applies (at 1430) a linear solver, such as Gauss elimination, LU decomposition, etc. to solve the region. These different linear solvers each have different accuracy and speed trade-offs. Accordingly, some embodiments adaptively select the appropriate linear solver to solve the region based on a computed amount of state change occurring at the linear region. It should be apparent to one of ordinary skill in the art that above described set of linear solvers is only an illustrative set and that any linear solver with its own speed and accuracy trade-off may be used in conjunction with or instead of the illustrative set.

When the received region is a non-linear region, the process applies (at 1440) a non-linear solver to solve the region. Again, some embodiments adaptively select the appropriate non-linear solver to solve the region based on a computed amount of state occurring at the non-linear region. For better speed performance but with less accuracy, some embodiments apply one or more relaxation based timing simulation engines (e.g., NanoSim, HSim, etc.) to the non-linear region to solve the non-linear region directly. For greater accuracy but with slower performance, some embodiments linearize the non-linear region (e.g., by using a Newton-Raphson algorithm) and then apply one of the above described linear solvers to solve the region.

Figure 15:
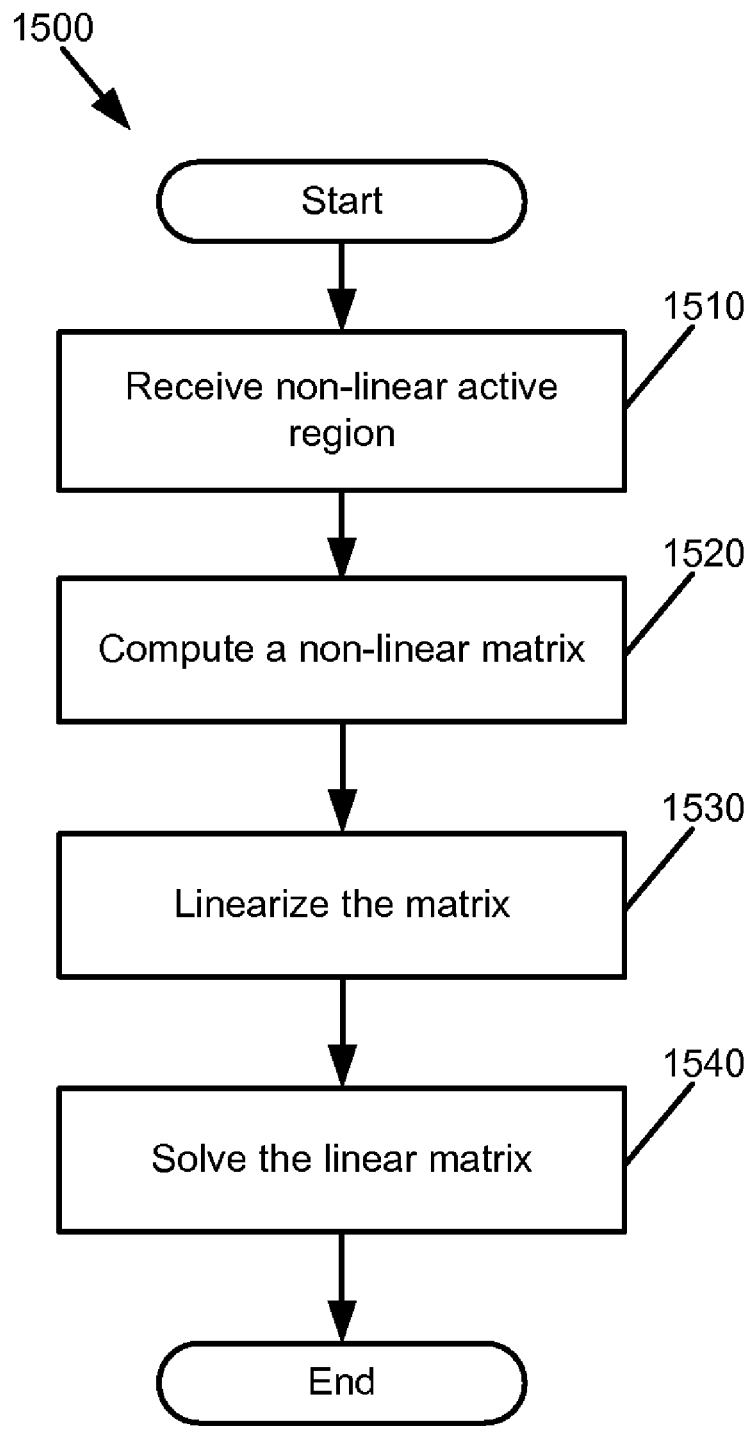
FIG. 15 presents a process for solving a non-linear region in accordance with some embodiments.

FIG. 15 presents a process 1500 for solving a non-linear region by linearizing the region and then applying a linear solver to solve the region in accordance with some embodiments. The process 1500 begins by receiving (at 1510) the non-linear active region. The process then computes (at 1520) a non-linear matrix from the non-linear region by modeling the region according to a non-linear differential equation model. The non-linear differential equation model is then transformed into the non-linear matrix through a nonlinear algebraic equation model using implicit numerical integration methods, such as backward Euler, trapezoidal method, etc.

The process linearizes (at 1530) the non-linear matrix. For instance, by using the Newton-Raphson algorithm a non-linear matrix is converted to a linear model that is represented as a sparse matrix. The sparse matrix is solved (at 1540) by using one of the above mentioned linear matrix solvers (e.g., Gauss elimination, LU decomposition, etc.).

Some embodiments solve the region by iteratively solving the matrix until convergence is achieved. At each iterative step, the solver monitors changes in the electrical state (e.g., node voltages, node charge, and device currents). The matrix converges when all changes in the monitored electrical state are within user specified tolerances. In some embodiments, once the electrical state of a sub-circuit converges, changes to the boundary conditions are evaluated. Each sub-circuit is connected to its neighbor through input and output ports. If the electrical state of a port changes significantly, all sub-circuits connected to that port are scheduled in a list to be resolved. All scheduled regions are solved iteratively until all changes in the state of sub-circuits and the ports are within the specified tolerance. In some embodiments, the simulation proceeds by taking the next time-step and the process is repeated until the end of simulation is reached.

Table 1 below provides an example of a non-linear voltage divider reaching convergence through multiple iterations of transient analysis.

TABLE 1

| Iteration # | Node Voltage | Change in Voltage | Status |
| --- | --- | --- | --- |
| 0 | 0 | — | Initial voltage |
| 1 | 0.29 | 0.29 | Large voltage change |
| 2 | 0.32 | 0.03 | Smaller voltage change |
| 3 | 0.33 | 0.01 | Converged to the specified voltage threshold |

In some embodiments, the simulator also reads-in the simulation vectors (e.g., user specified input values) which serve as the input stimuli. In some embodiments, the simulator also uses these vectors to determine the amount of circuit activity. By looking ahead into how this activity changes over time, the simulator then predicts the time interval for performing the next analysis as well as which solver to use to do the analysis (e.g., it adapts to the changes in simulation environments based on real-time conditions).

As a result of partitioning linear regions from the non-linear regions, some of the computational overhead involved with solving a non-linear region is avoided. This frees resources that can instead be allocated to increasing accuracy, capacity, or speed of the overall circuit simulation. Moreover, the speed of the circuit simulation depends upon the complexity of the device models within the regions and the size of the system matrix. The time spent in solving a sparse linear matrix grows super-linearly with the size of the matrix. However, by processing only regions at a time, some embodiments restrict the size of the matrices that are solved further increasing the efficiency by which the simulation occurs.

iii. State Change Based Adaptive Simulation

Some embodiments adaptively simulate regions based on behavioral criteria of each simulated region. Such adaptive simulation allows some embodiments of the invention to further tune the circuit simulation such that simulation engines with greater accuracy are targeted to regions with the greatest amount of state change from one time step of the transient analysis to the next time step and faster and less accurate simulation engines are targeted to regions with only a slight variance from one time step to the next time step. In this manner, any region may be simulated different from any other region. This allows computational resources to be targeted differently. As a consequence, accuracy, speed, and supported capacity of the overall circuit simulation increase.

Figure 16:
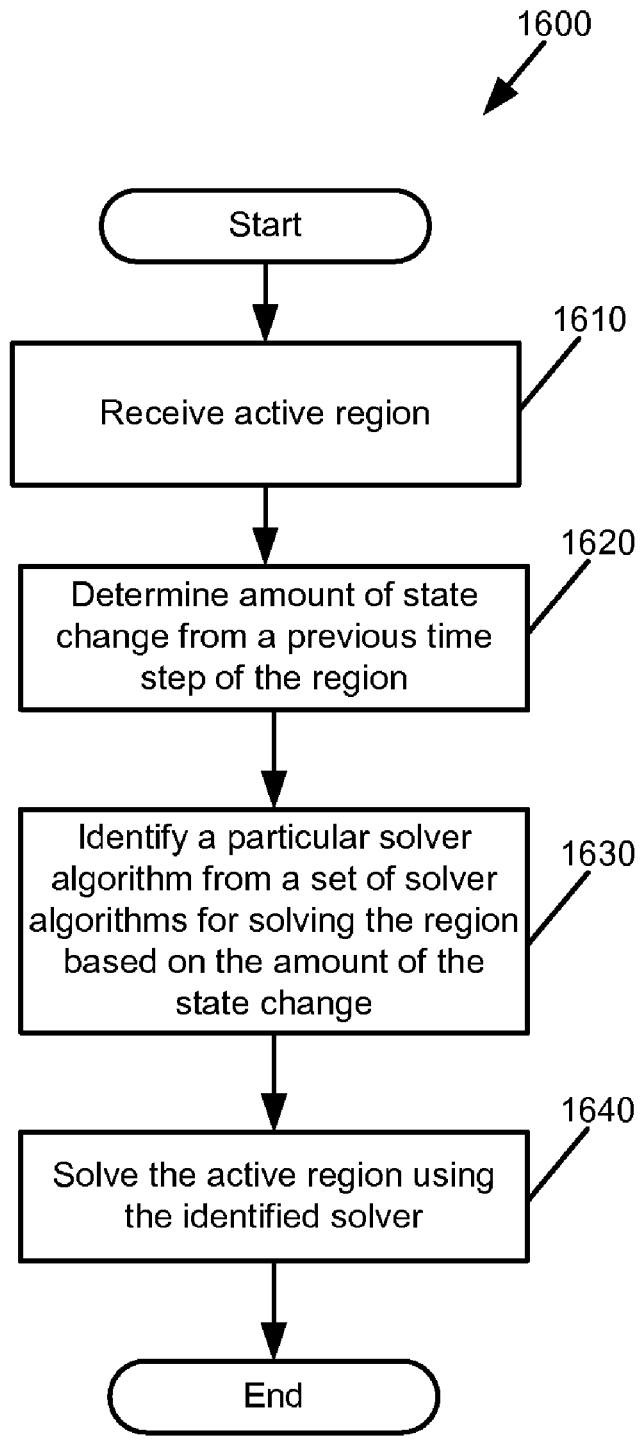
FIG. 16 presents a process for performing adaptive simulation based on an amount of state change occurring at a region at a particular time step of transient analysis of some embodiments.

One such behavioral criterion considered by some embodiments when performing the adaptive simulation is the amount of state change occurring at an active region. FIG. 16 presents a process 1600 for performing adaptive simulation based on an amount of state change occurring at a region at a particular time step of transient analysis of some embodiments. The process 1600 begins by receiving (at 1610) an active region for analysis. The process then computes (at 1620) the amount of state change occurring at the region. Next, based on the resulting amount, a particular solver is adaptively selected (at 1630) to solve and optimize the simulation for that region in order to achieve a desired accuracy threshold and speed threshold. The region is then solved (at 1640) using the selected solver.

For a small amount of state change occurring at a region at a particular time step of the transient analysis, less accurate simulation engines that approximate the change may be used. In some embodiments, these simulation engines are less accurate by virtue of the fact that fewer iterations will be performed in order to reach an acceptable convergence.

For example, a relaxation based method may be used to solve the system of equations for that region efficiently with some accuracy trade-off. A solution is reached in successive iterations where the speed and accuracy of the relaxation method can be controlled by limiting the number of iterations. Such a method is well suited to compute approximate state of a region by using limited iterations. They are used in timing simulation of digital circuits with loose accuracy tolerances. Timing simulators, such as NanoSim, HSim, etc., provide functional and approximate timing information of digital signals (e.g., gate delays, slew and skew rates, etc.). Timing simulators run faster than circuit simulators by using simpler device models, exploiting uni-directionality of digital signals and the latency of various partitions during a transient simulation.

For a large amount of state change occurring at a region, there is often insufficient information contained within the region itself from which to properly simulate the behavior occurring within the region at a particular time step. To increase the accuracy of the solver, some embodiments compute the state of a region using its previous states and boundary conditions. As such, the circuit-state may be a composite of the states of one or more individual regions. The boundary conditions include the state of one or more input ports, the state of one or more output ports, or both.

FIG. 17 conceptually illustrates the adaptive selection of different solvers that is performed by some embodiments based on different state changes occurring at a particular active region over multiple time steps. Specifically, an input waveform 1710 and an output waveform 1720 for the region are shown.

When transitioning from time step T=0 to time step T=1, the input 1710 transitions from a 0V state to a 3V state, but this input transition has little to no effect on the output 1720. Accordingly, a first solver is applied to optimally solve the region for such an output transition. Then at the transition between time step T=1 to time step T=2, the input 1710 transitions from a 3V state to a 5V which causes a 0V to 5V transition to occur at the output 1720. Some embodiments then apply a second solver to optimally solve the region for such an output transition. Finally, when transitioning from time step T=2 to time step T=3, the input 1710 remains constant. At this transition, the region becomes passive and is thus removed from the set of active regions to be solved.

Figure 18:
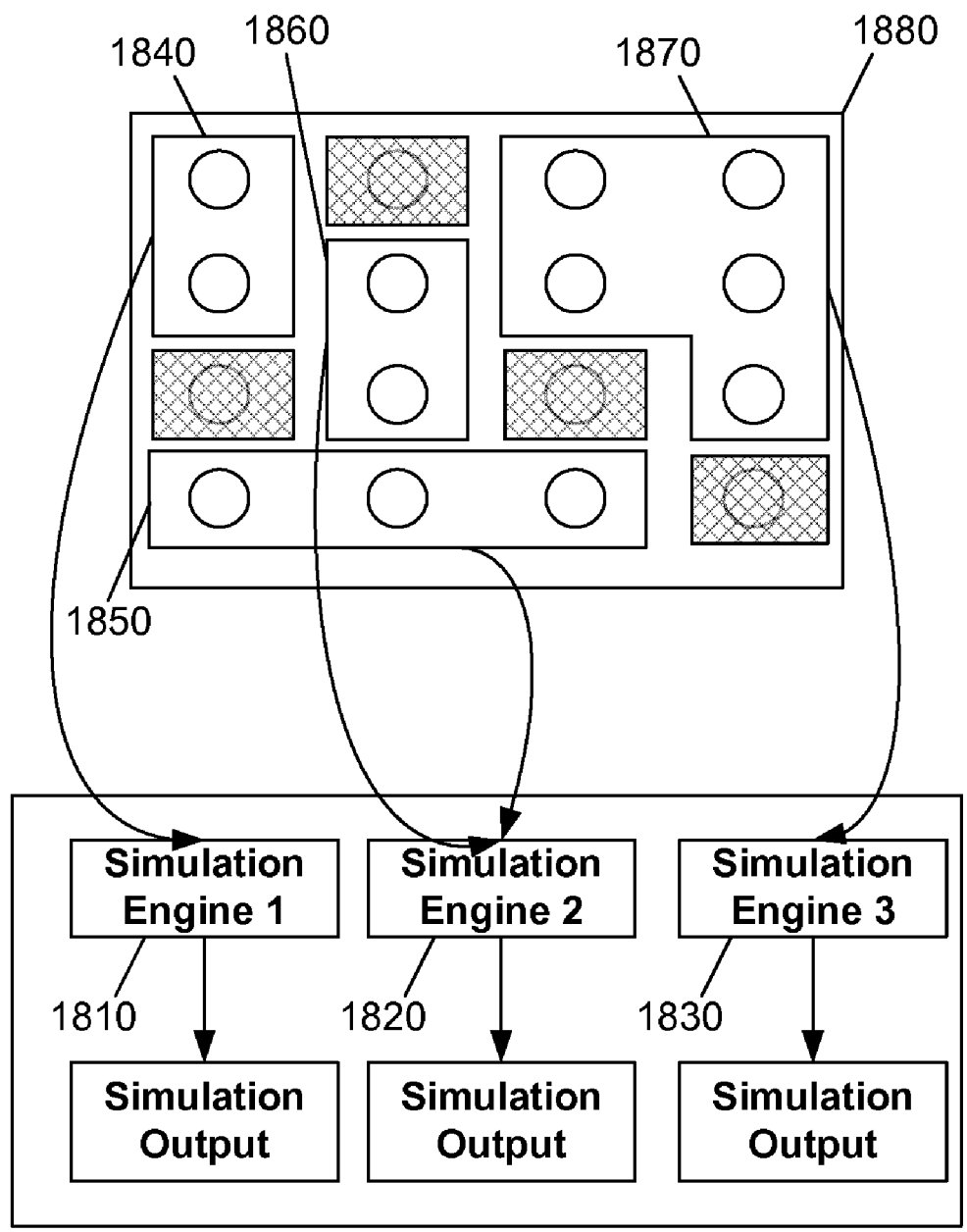
FIG. 18 conceptually illustrates the adaptive controller of some embodiments adaptively applying different simulation modes or solution algorithms to different active regions of a circuit design.

Accordingly, some embodiments adapt to the changing conditions of the region itself during each time step of the transient analysis. This is further illustrated in FIG. 18. FIG. 18 conceptually illustrates the adaptive controller of some embodiments adaptively applying different simulation engines 1810-1830 or solution algorithms to different active regions 1840-1870 of a circuit design 1880. Each solution algorithm produces output with varying degrees of accuracy. However, as noted above, for those regions where the state variance is minimal between time steps, then a low degree of accuracy is sufficient without compromising the accuracy of the overall simulation. The combined set of results from the various simulation engines allows designers to verify the design. A design verified by the adaptive simulation of some embodiments can then be used to manufacture an IC.

Figure 19:
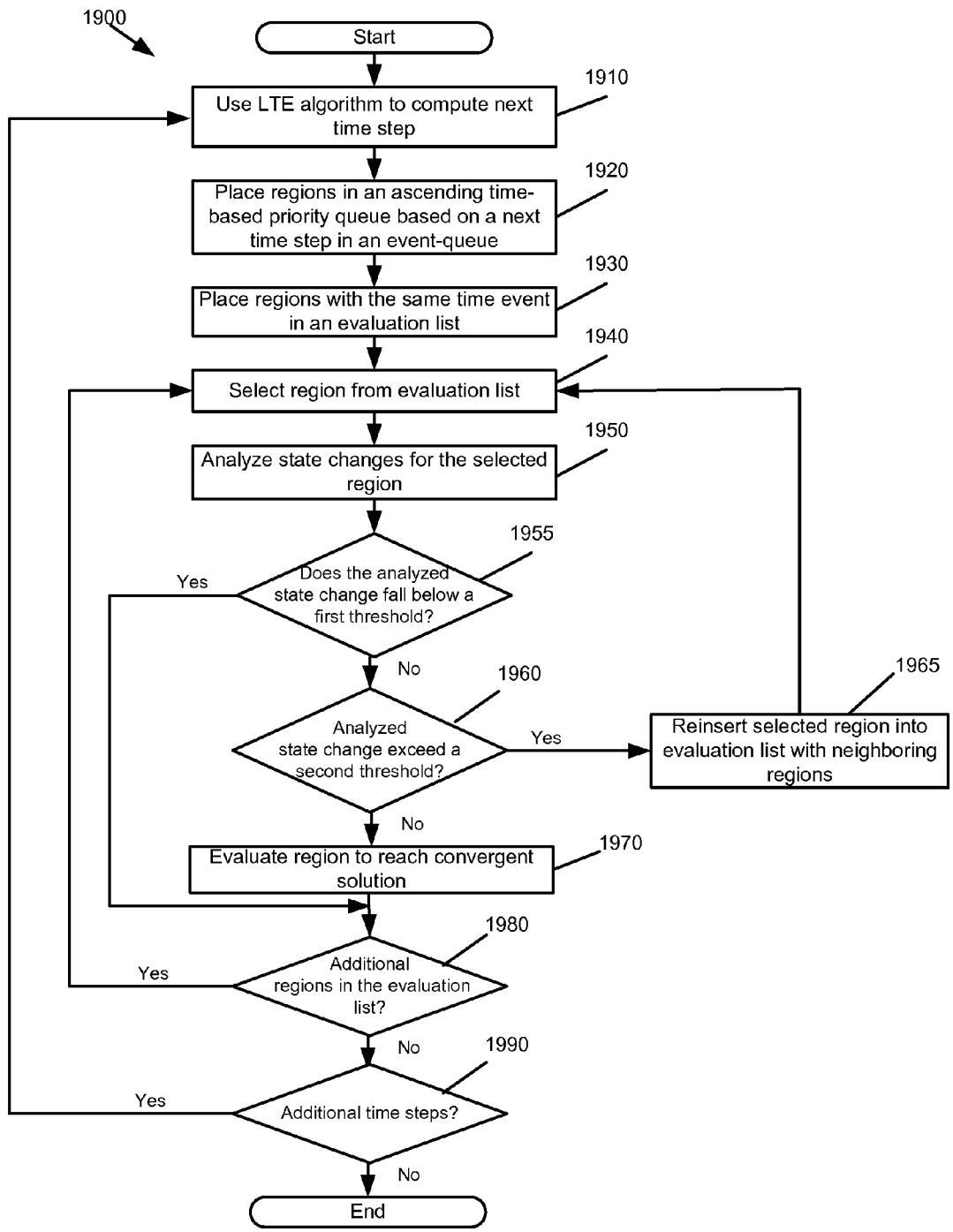
FIG. 19 presents a process for implementing the real-time adaptive transient simulation in accordance with some embodiments.

Some embodiments perform the adaptive transient simulation in real-time. FIG. 19 presents a process 1900 for implementing the real-time adaptive transient simulation in accordance with some embodiments. The process 1900 begins by using (at 1910) a LTE algorithm to compute the next time step for each region in the circuit design. A time step is the time at which the transient state of a region needs to be evaluated.

The process places (at 1920) each of the regions in an ascending time-based priority queue based on a next time step in an event-queue. Accordingly, the queue includes both active and passive regions where only the active regions for each time step are solved. All regions at the top of the event-queue (i.e., with same event time) are popped-off (at 1930) and inserted in an evaluation-list. The process selects (at 1940) a region from the evaluation list and analyzes (at 1950) state change for the selected region.

If the state change falls (at 1955) below a first specified threshold, then the region is a passive region. The process does not evaluate the region and instead proceeds to determine (at 1980) whether additional regions remain to be processed within the time step. Otherwise, the region is an active region and the process determines (at 1960) if the state change exceeds a second specified threshold. In some embodiments, the first threshold is the same as the second threshold and step 1960 involves determining the amount by which the state change of a region exceeds the first threshold. In other embodiments, the first and second thresholds are different values.

If the state of an evaluated active region changes significantly (e.g., exceeds the second specified threshold), the process inserts (at 1965) the region back in the evaluation list for re-evaluation along with one or more neighboring regions. Specifically, the process inserts one or more fan-out regions connected to one or more fan-out nodes into the evaluation-list if the voltage state at the fan-out nodes change more than a specified voltage threshold. Similarly, the process inserts one or more fan-in regions connected to one or more fan-in ports if the charge or the current at the fan-in ports change more than the respective thresholds. Additionally, depending on the amount of state change, some embodiments control the number of fan-out regions to connect to the fan-out nodes and the number of fan-in regions to connect to the fan-in ports.

Regions that do not exceed the second threshold, are evaluated (at 1970) iteratively until they converge using one or more simulation engines that are adaptively selected based on the amount of state change as described above. It should be apparent to one of ordinary skill in the art that the process 1900 may include additional threshold comparisons. For example, the second threshold comparison may be used to determine whether to include the fan-out regions and a third threshold comparison may be used to determine whether to include the fan-in regions.

After convergence, each region is reclassified as either steady or active. The process then determines (at 1980) if additional regions remain in the evaluation list for the selected time step. If additional regions remain, the process returns to step 1940 to analyze the next region. Otherwise, the process determines (at 1990) if additional time steps remain to be computed in the transient analysis. If so, a new time-event is computed (at 1910) and the region is inserted in the event-queue. The process is repeated until the end of simulation time is reached.

Figure 20:
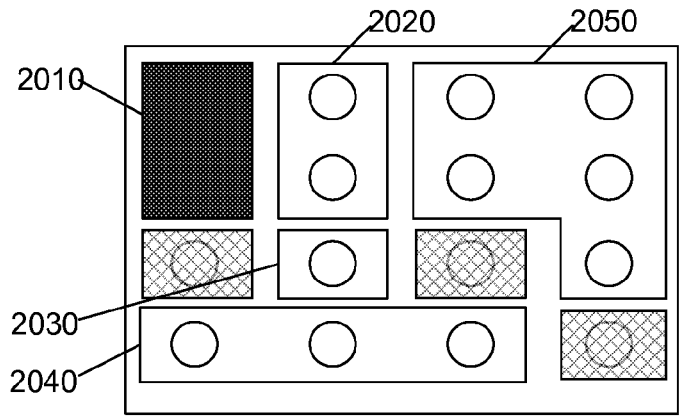
FIGS. 20-22 conceptually illustrate the adaptive modification of a region to include fan-in ports and fan-out ports for a region with a large state change in accordance with some embodiments.
Figure 21:
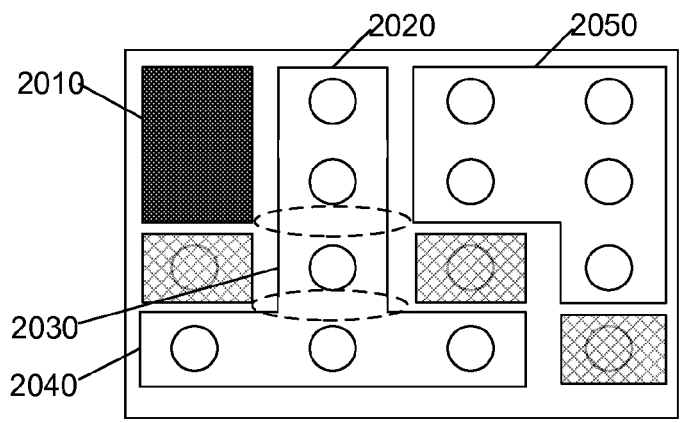
Figure 22:
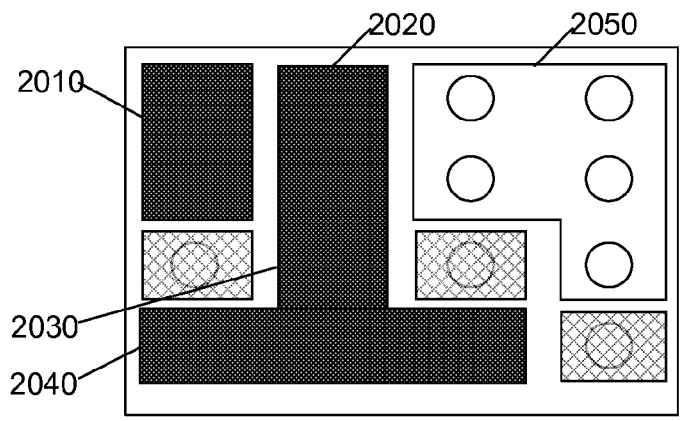

FIGS. 20-22 conceptually illustrate the adaptive modification of a region to include fan-in ports and fan-out ports for a region with a large state change in accordance with some embodiments. FIG. 20 conceptually illustrates a set of active regions 2010-2050 that are to be processed at a particular time step of transient analysis. In this example, the region 2010 had a small amount of state change (as shown by the darker shading) and was processed independently of other neighboring regions. FIG. 21 then shows the processing of region 2030. In this example, the neighboring regions 2020 and 2040 provide fan-in ports into region 2030, receive fan-out ports of region 2030, or both. Assuming that region 2030 includes a large amount of state change, the region cannot be accurately processed by itself. Accordingly, some embodiments include the fan-in ports of region 2020 and the fan-out ports of region 2040 when processing region 2030. Then if sufficient information is retained within the combined region, the region can be accurately solved to within a user specified threshold as shown in FIG. 22.

Figure 23:
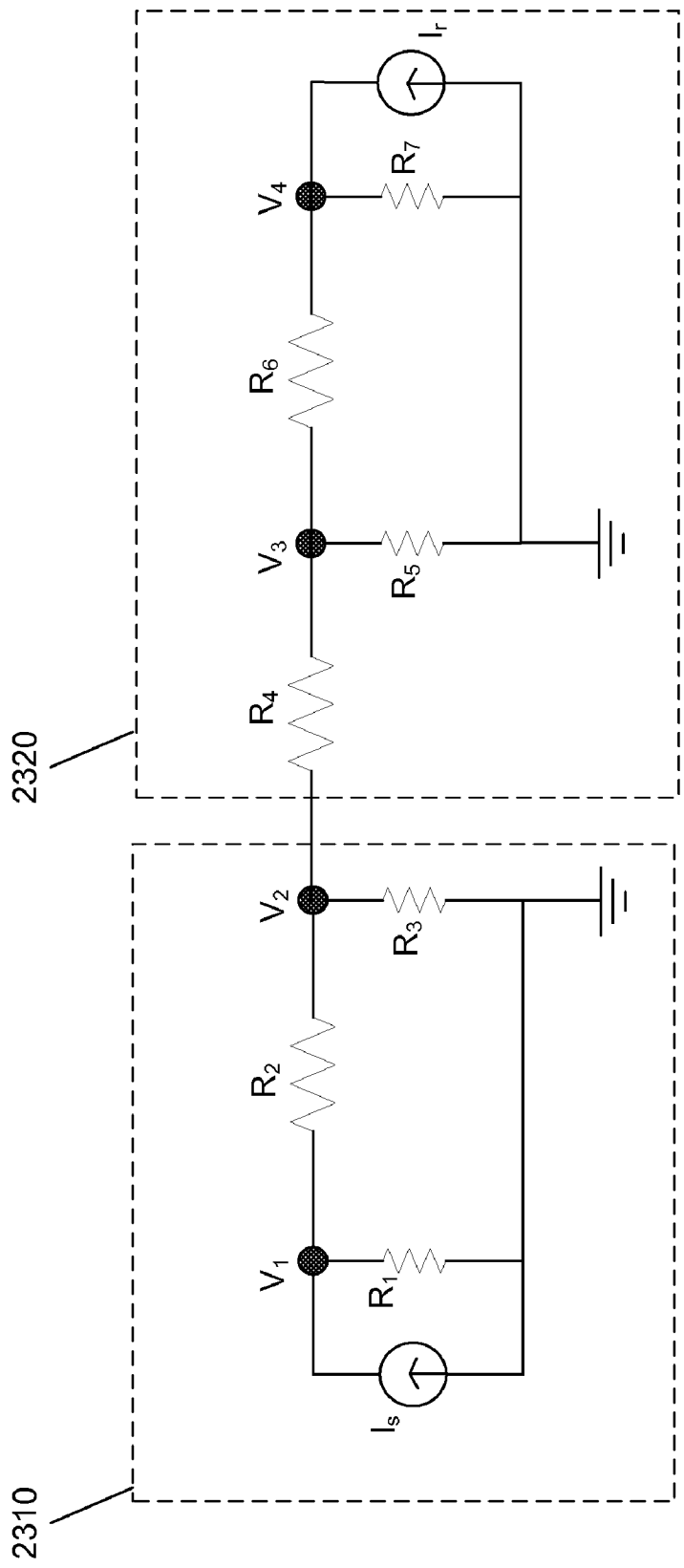
FIGS. 23-24 provide a detailed illustration for the adaptive modification of a region to include fan-in ports and fan-out ports of neighboring regions in accordance with some embodiments.
Figure 24:
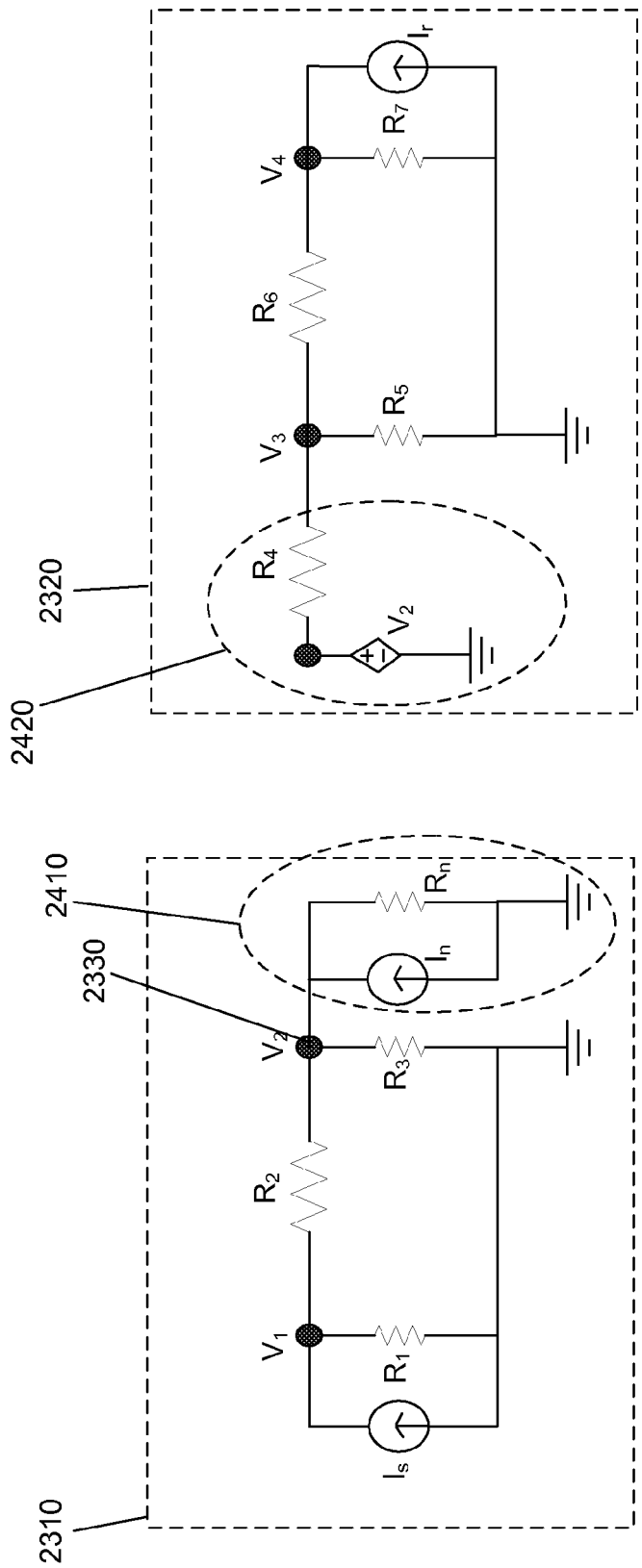

FIGS. 23-24 provide a detailed illustration for the adaptive modification of a region to include fan-in ports and fan-out ports of neighboring regions in accordance with some embodiments. FIG. 23 presents a first region 2310 that includes nodes and devices with a first set of state information (e.g., $R_1$-$R_3$, $V_1$-$V_2$, and $I_s$) and a second region 2320 that includes nodes and devices with a second set of state information (e.g., $R_4$-$R_7$, $V_3$-$V_4$, $I_r$). FIG. 24 then illustrates the Norton loading 2410 of region 2320 included as part of the fan-out port of region 2310 and the VCVS model 2420 from region 2310 included as part of the fan-in port of region 2320. Specifically, the Norton load model 2410 is modeled as a current source $I_n$ and an impedance $R_n$.

Equations (14) and (15) below illustrate the resulting MNA equations for region 2310 and equations (16) and (17) below illustrate the resulting MNA equations for region 2320.

$$G11*V1+G12*V2=Is \quad (14)$$

$$G21*V1+((G22+Gn)*V2)=In \quad (15)$$

$$G33*V3+G34*V4=G23*(V2-V3) \quad (16)$$

$$G43*V3+G44*V4=Ir \quad (17)$$

In these set of equations, G11 represents ((1/R1)+(1/R2)), G12 represents (-(1/R2)), G21 represents (-(1/R2)), G22 represents ((1/R2)+(1/R3)), Gn represents the Norton conductance, In represents the Norton current, G33 represents ((1/R5)+(1/R6)), G34 represents (-(1/R6)), G43 represents (-(1/R6)), G44 represents ((1/R6)+(1/R7)), G23 is equivalent to R4, and V2 is the fan-out voltage from Region 2310 into a fan-in port of Region 2320.

As shown in the equations above, the loading of region 2320 on region 2310 is added on equation (15) for node 2330. Similarly, the fan-in to region 2320 is modeled as VCVS 2420 with the controlling voltage at node 2330. The solution for the set of equations (14)-(17) is obtained by solving a corresponding MNA matrix of regions 2310 and 2320 iteratively until convergence is reached.

Figure 25:
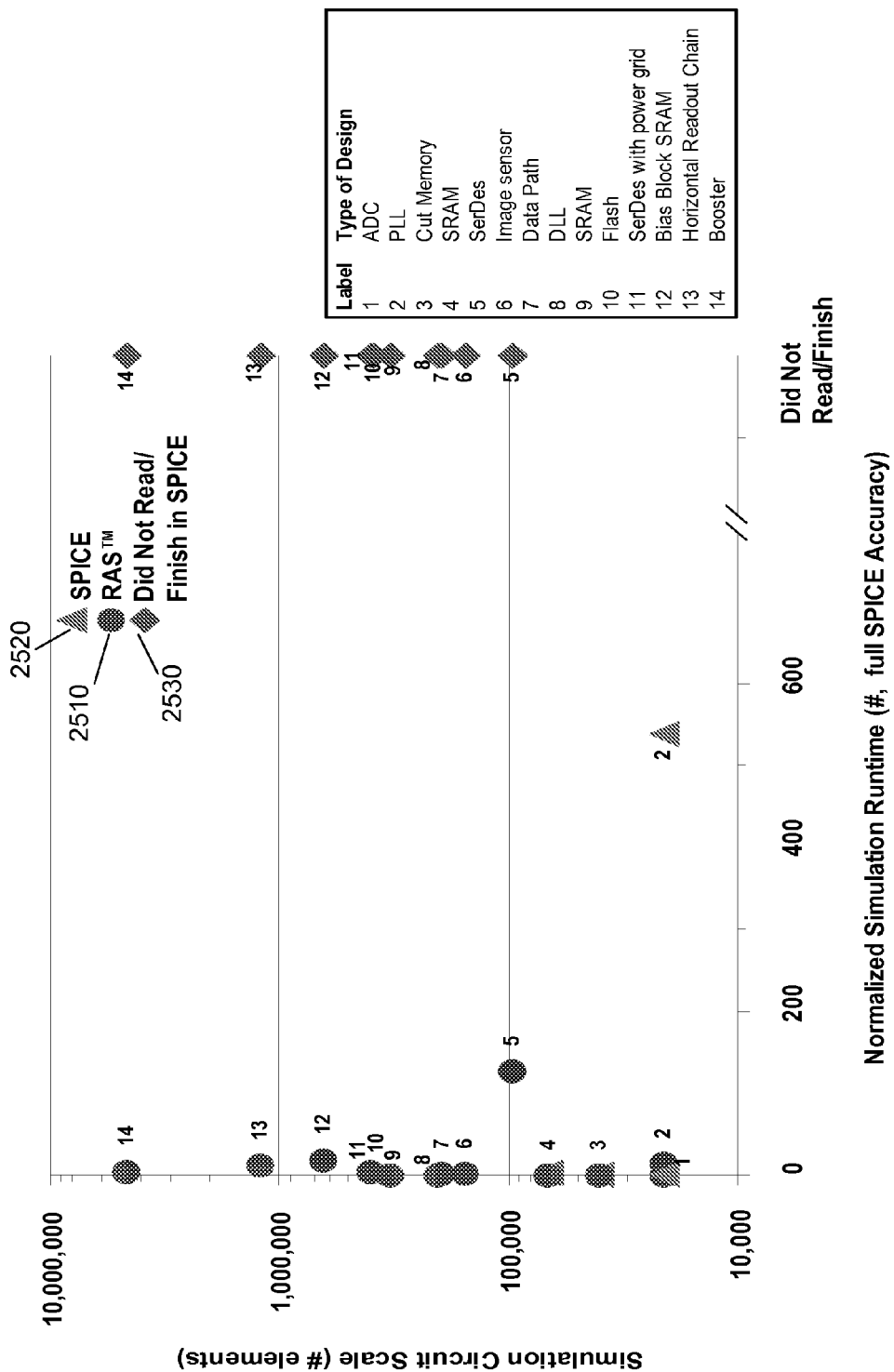
FIG. 25 illustrates performance/capacity comparison data of some embodiments.

FIG. 25 illustrates performance/capacity comparison data of some embodiments. Specifically, FIG. 25 shows comparative runtime performance and capacity data for several example designs analyzed using both some embodiments of the present invention represented by the circles 2510 and conventional SPICE simulators represented by the triangle shapes 2520 and the diamond shapes and 2530.

As shown, some embodiments (see circle 2510 in FIG. 25) deliver full SPICE-like accuracy with orders-of-magnitude higher capacity and performance. This capability can enable the realization of industry-leading designs with comprehensive process, voltage, and, temperature (PVT), operational and variation coverage prior to tape-out, identifying design flaws missed with conventional methodologies and tools that would have required respins, resulting in first silicon success.

It should be apparent to one of ordinary skill in the art that some embodiments support multiple or all of the standard simulation models including BJT, Mextram, VBIC, BSIM4, BSIM3v3, B3SOI, B3SOIPD, MOS11, MOS3 and JFET. Some embodiments efficiently handle post-layout simulation with RLC parasitics on signal nets and power nets. Some embodiments also have RC reduction technology and support for DSPF. Some embodiments use exact device models and fully solve Kirchhoff's Current Law (KCL) and Kirchhoff's Voltage Law (KVL) circuit equations to guarantee SPICE-like full accuracy.

IV. Computer System

Many of the above-described components (e.g., input parser, hierarchical partitioner, adaptive controller, simulation engines, etc.) implement some or all the above described functionality through software processes that are specified as a set of instructions recorded on a machine readable medium (also referred to as computer readable medium). When these instructions are executed by one or more computational element(s) (such as processors or other computational elements like ASICs and FPGAs), they cause the computational element(s) to perform the actions indicated in the instructions. Computer is meant in its broadest sense, and can include any electronic device with a processor. Examples of computer readable media include, but are not limited to, CD-ROMs, flash drives, RAM chips, hard drives, EPROMs, etc.

In this specification, the term "software" is meant in its broadest sense. It can include firmware residing in read-only memory or applications stored in magnetic storage which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention.

Figure 26:
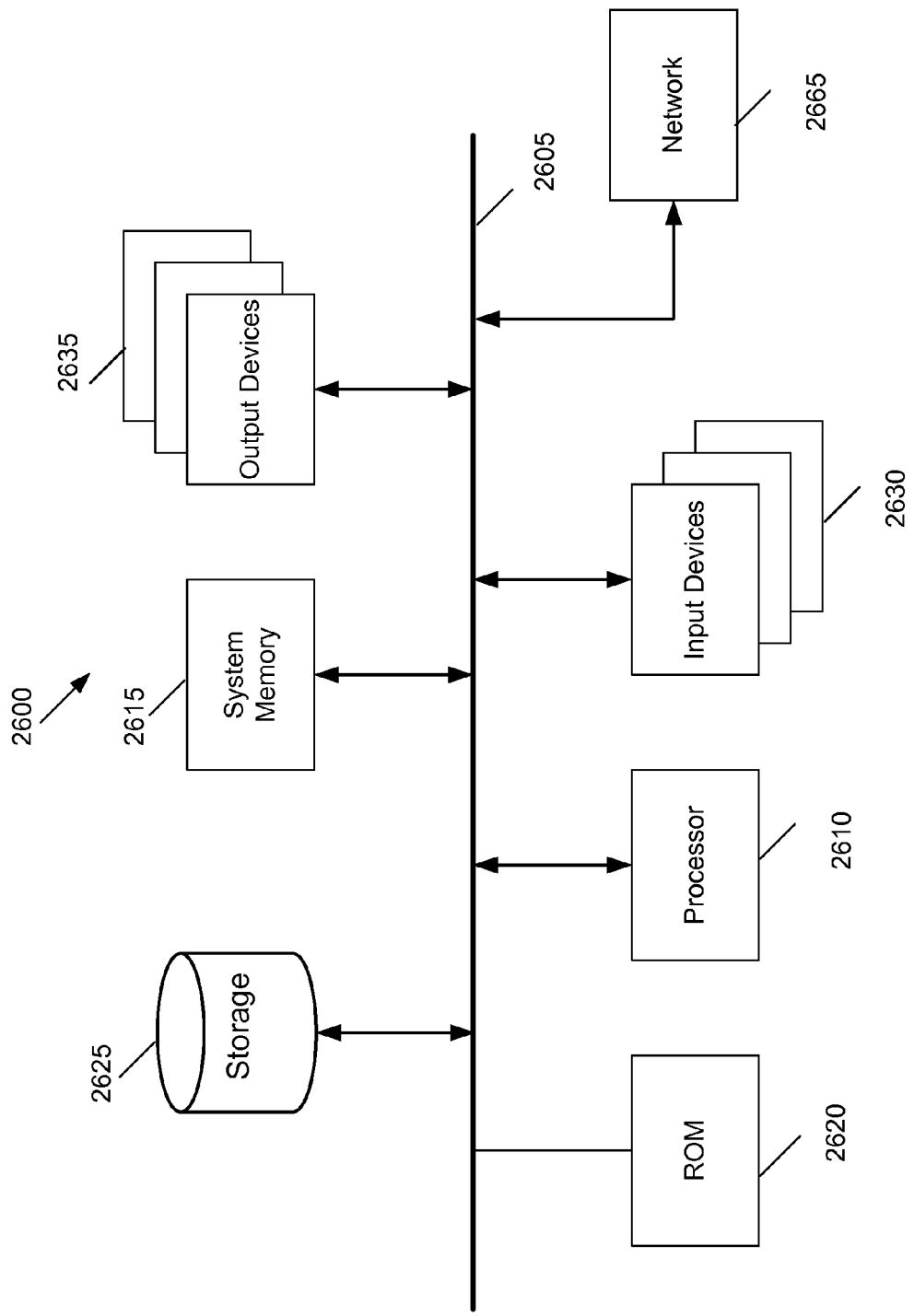
FIG. 26 illustrates a computer system with which some embodiments of the invention are implemented.

FIG. 26 illustrates a computer system with which some embodiments of the invention are implemented. Such a computer system includes various types of computer readable mediums and interfaces for various other types of computer readable mediums. Computer system 2600 includes a bus 2605, a processor 2610, a system memory 2615, a read-only memory 2620, a permanent storage device 2625, input devices 2630, and output devices 2635.

The bus 2605 collectively represents all system, peripheral, and chipset buses that communicatively connect the numerous internal devices of the computer system 2600. For instance, the bus 2605 communicatively connects the processor 2610 with the read-only memory 2620, the system memory 2615, and the permanent storage device 2625. From these various memory units, the processor 2610 retrieves instructions to execute and data to process in order to execute the processes of the invention.

The read-only-memory (ROM) 2620 stores static data and instructions that are needed by the processor 2610 and other modules of the computer system. The permanent storage device 2625, on the other hand, is a read-and-write memory device. This device is a non-volatile memory unit that stores instructions and data even when the computer system 2600 is off. Some embodiments of the invention use a mass-storage device (such as a magnetic or optical disk and its corresponding disk drive) as the permanent storage device 2625.

Other embodiments use a removable storage device (such as a floppy disk, flash drive, or ZIP® disk, and its corresponding disk drive) as the permanent storage device. Like the permanent storage device 2625, the system memory 2615 is a read-and-write memory device. However, unlike storage device 2625, the system memory is a volatile read-and-write memory, such a random access memory (RAM). The system memory stores some of the instructions and data that the processor needs at runtime. In some embodiments, the invention's processes are stored in the system memory 2615, the permanent storage device 2625, and/or the read-only memory 2620.

The bus 2605 also connects to the input and output devices 2630 and 2635. The input devices enable the user to communicate information and select commands to the computer system. The input devices 2630 include alphanumeric keyboards and pointing devices (also called "cursor control devices"). The input devices 2630 also include audio input devices (e.g., microphones, MIDI musical instruments, etc.). The output devices 2635 display images generated by the computer system. For instance, these devices display a GUI. The output devices include printers and display devices, such as cathode ray tubes (CRT) or liquid crystal displays (LCD).

Finally, as shown in FIG. 26, bus 2605 also couples computer 2600 to a network 2665 through a network adapter (not shown). In this manner, the computer can be a part of a network of computers (such as a local area network ("LAN"), a wide area network ("WAN"), or an Intranet, or a network of networks, such as the internet. For example, the computer 2600 may be coupled to a web server (network 2665) so that a web browser executing on the computer 2600 can interact with the web server as a user interacts with a GUI that operates in the web browser.

As mentioned above, the computer system 2600 may include one or more of a variety of different computer-readable media. Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ZIP® disks, read-only and recordable blu-ray discs, any other optical or magnetic media, and floppy disks.

It should be recognized by one of ordinary skill in the art that any or all of the components of computer system 2600 may be used in conjunction with the invention. For instance, some or all components of the computer system described with regards to FIG. 26 comprise some embodiments of the input parser, hierarchical partitioner, adaptive controller, simulation engines, and other components described above. Moreover, one of ordinary skill in the art will appreciate that any other system configuration may also be used in conjunction with the invention or components of the invention. Thus, one of ordinary skill in the art would understand that the invention is not to be limited by the foregoing illustrative details, but rather is to be defined by the appended claims.

The invention claimed is:

1. A method for verifying a mixed-signal circuit design, the method comprising:

identifying a plurality of regions for partitioning the circuit design;

for each of a plurality of simulation iterations, computing an amount of state change in each region when transitioning from a previous simulation iteration to a current simulation iteration; and for each of the plurality of simulation iterations, selecting a set of active regions from the plurality of regions to adaptively simulate using a plurality of different simulation engines to generate simulation output that simulates behavior of the circuit design, said selecting the set of active regions based on the computed amount of state change in a region exceeding a first threshold, wherein adaptively simulating the set of active regions comprises, for each active region at the current simulation iteration, identifying one of the plurality of simulation engines to solve the active region based on the computed amount of state change occurring at the active region exceeding a second threshold, the second threshold being different than the first threshold, wherein each simulation engine of the plurality of simulation engines produces simulation output based on different accuracy and speed tradeoffs.

2. The method of claim 1, wherein the set of active regions comprises fewer regions than the plurality of regions.

3. The method of claim 1, wherein selecting the set of active regions further comprises, for each active region at the current simulation iteration, comparing the computed amount of state change occurring at the active region between the previous iteration and current iteration against the second threshold, wherein a difference between the computed amount of state change for the active region and the second threshold determines which of the simulation engines to use to adaptively simulate the active region.

4. The method of claim 1, wherein adaptively simulating a set of the regions further comprises solving a region having a repeating pattern to produce a simulation result and reusing the simulation result for other regions having the same repeating pattern without solving said other regions.

5. The method of claim 1, wherein identifying the plurality of regions comprises partitioning the circuit design into the plurality of regions, each region comprising a set of devices of the circuit design, a set of nodes to represent connectivity between at least two devices, and electrical state information for the nodes and devices.

6. The method of claim 5, wherein state information comprises voltage, current, and charge information for the region.

7. The method of claim 1 further comprising performing a DC analysis of the plurality of regions to determine state information for each region of the plurality of regions at a first simulation iteration of the plurality of simulation iterations.

8. The method of claim 1, wherein said selecting the set of active regions further comprises identifying a particular region as a passive region that is not to be solved with a simulation engine at the current simulation iteration when the amount of state change for the particular region does not exceed the first threshold.

9. A method for verifying a mixed-signal circuit design, the method comprising:

partitioning the circuit design into a set of regions;

identifying a plurality of regions in the set of regions for which an amount of state variance in each region exceeds a first threshold;

for each region in the plurality of identified regions, identifying a solver from a plurality of solvers for solving the region based on which threshold in a plurality of thresholds the state variance in the region exceeds; and solving each region using its corresponding identified solver to produce a simulation output for verifying said region.

10. The method of claim 9 further comprising, before solving each region, performing an adaptive DC analysis of the plurality of regions to determine a steady state for each of the regions.

11. The method of claim 10, wherein the adaptive DC analysis comprises determining the steady state using a plurality of matrices, each matrix modeling each of the regions.

12. The method of claim 10, wherein the adaptive DC analysis comprises determining the steady state for the circuit design by evaluating each of the regions separately.

13. The method of claim 12, wherein determining the steady state for each region comprises applying a homotopy solver to a non-convergent region.

14. The method of claim 9, wherein the amount of state variance comprises changes in at least one of a voltage state, current state, and charge state of a region.

15. The method of claim 9, wherein identifying the solver comprises applying a first solver to a region with an amount of state variance that exceeds a threshold less than a particular amount and applying a second solver to a region with an amount of state variance that exceeds a threshold greater than the particular amount, wherein the first solver has a greater accuracy and slower speed than the second solver.

16. The method of claim 9 further comprising identifying a particular region as a passive region that is not to be solved with a solver when the amount of state variance for the particular region does not exceed the first threshold.

17. A circuit verification tool for adaptively simulating different regions of a circuit design using a plurality of different simulation engines based on a set of criteria, the circuit verification tool comprising:

a first set of simulation engines to adaptively apply to simulate regions with a computed amount of variance falling below a specified threshold;

a second set of simulation engines to adaptively apply to simulate regions with a computed amount of variance exceeding the specified threshold, wherein the first and second sets of simulation engines have different accuracy and speed trade-offs; and a controller for computing the amount of variance at each region and for selectively applying a simulation engine from the first and second sets of simulation engines based on the computed amount of variance to produce simulation output that verifies circuit behavior at each region.

18. The circuit verification tool of claim 17, wherein the controller is further for performing an adaptive DC analysis to determine a steady state for each of the regions.

19. The circuit verification tool of claim 18, wherein performing the adaptive DC analysis comprises determining the steady state for the circuit design by evaluating each of the regions separately.

20. A non-transitory computer readable storage medium storing a computer program for verifying a mixed-signal circuit design, the computer program comprising:

a set of instructions for identifying a plurality of regions for partitioning the circuit design;

a set of instructions for computing, for each of a plurality of simulation iterations, an amount of state change in each region when transitioning from a previous simulation iteration to a current simulation iteration; and a set of instructions for selecting, in each of the plurality of iterations, a set of active regions from the plurality of regions to adaptively simulate using a plurality of different simulation engines to generate simulation output that simulates behavior of the circuit design, said selecting the set of active regions based on the computed amount of state change exceeding a first threshold, wherein the set of instructions for adaptively simulating the set of active regions comprises a set of instructions for identifying, for each active region at the current simulation iteration, one of the plurality of simulation engines to solve the active region based on the computed amount of state change occurring at the active region exceeding a second threshold, the second threshold being different than the first threshold, wherein each simulation engine of the plurality of simulation engines produces simulation output based on different accuracy and speed tradeoffs.

21. The non-transitory computer readable storage medium of claim 20, wherein the set of instructions for adaptively simulating comprises a set of instructions for comparing, for each active region at the current simulation iteration, the computed amount of state change occurring at the active region between the previous iteration and current iteration against the second threshold, wherein a difference between the computed state change for the active region and the second threshold determines which of the simulation engines to use to adaptively simulate the active region.

22. The non-transitory computer readable storage medium of claim 20, wherein the computer program further comprises a set of instructions for performing a DC analysis of the plurality of regions to determine state information for each region of the plurality of regions at a first simulation iteration of the plurality of simulation iterations.

23. The non-transitory computer readable storage medium of claim 20, wherein the set of instructions for selecting the set of active regions further comprises a set of instructions for identifying a particular region as a passive region that is not to be solved with a simulation engine at the current simulation iteration when the amount of state change for the particular region does not exceed the first threshold.

\* \* \* \* \*